(12) United States Patent
Park et al.

(10) Patent No.: US 12,543,418 B2
(45) Date of Patent: Feb. 3, 2026

(54) DISPLAY DEVICE INCLUDING A CAPPING LAYER

(71) Applicant: Samsung Display Co., LTD., Yongin-si (KR)

(72) Inventors: Ji Yun Park, Hwaseong-si (KR); Young Gu Kim, Yongin-si (KR); Yun Hee Park, Hwaseong-si (KR); Suk Kung Chei, Suwon-si (KR); Kyung Seon Tak, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 897 days.

(21) Appl. No.: 17/846,700

(22) Filed: Jun. 22, 2022

(65) Prior Publication Data

US 2023/0155077 A1    May 18, 2023

(30) Foreign Application Priority Data

Oct. 27, 2021    (KR) .......................... 10-2021-0144404

(51) Int. Cl.
*H10H 20/851* (2025.01)
*C08L 83/08* (2006.01)
(Continued)

(52) U.S. Cl.
CPC ......... *H10H 20/8514* (2025.01); *C08L 83/08* (2013.01); *H10H 20/8312* (2025.01); *H10H 20/857* (2025.01); *H10H 29/142* (2025.01)

(58) Field of Classification Search
CPC ........... H10H 20/8514; H10H 20/8312; H10H 20/857; H10H 29/142; H10H 20/819; H10H 20/8515; H10H 20/84; H10H 20/851; H10H 20/854; C08L 83/08; C08K 2201/003; C08K 7/22; C08G 77/54; C08G 77/18; C08G 77/20; C09D 183/10; C09D 183/14; H01L 25/167; H01L 51/5253; H01L 51/56; H01L 2251/303; H01L 27/3258; H01L 51/5256; H01L 2251/301; H01L 2251/558;
(Continued)

(56) References Cited

U.S. PATENT DOCUMENTS 7,696,286 B2 *    4/2010    Endo .................... H01L 23/293
                                                            525/481
8,373,928 B2 *    2/2013    Ha ........................ G02B 5/3058
                                                            359/485.05
(Continued)

FOREIGN PATENT DOCUMENTS

JP    6571403    9/2019
JP    6731651    7/2020
(Continued)

*Primary Examiner* — Caleb E Henry
(74) *Attorney, Agent, or Firm* — Womble Bond Dickinson (US) LLP

(57) ABSTRACT

A display device is provided. The display device comprises a transistor layer disposed on a substrate, a light emitting element layer disposed on the transistor layer, a wavelength conversion layer disposed on the light emitting element layer, and a first capping layer disposed on the wavelength conversion layer, wherein the first capping layer includes a base, and hollow particles mixed in the base. The base includes polysilazane, the polysilazane including siloxane.

20 Claims, 14 Drawing Sheets

(51) Int. Cl.
*H10H 20/831* (2025.01)
*H10H 20/857* (2025.01)
*H10H 29/14* (2025.01)

(58) Field of Classification Search
CPC ...... H10D 86/40; H10K 50/844; H10K 71/00; H10K 2102/00; H10K 59/124; H10K 50/8445; H10K 2102/351
See application file for complete search history.

(56) References Cited

U.S. PATENT DOCUMENTS

| | | | | |
|---|---|---|---|---|
| 8,759,822 | B2* | 6/2014 | Lee | H10K 59/873 257/40 |
| 9,340,700 | B2* | 5/2016 | Iwashige | C08L 63/00 |
| 10,249,692 | B2* | 4/2019 | Lee | H10K 59/873 |
| 10,304,870 | B2* | 5/2019 | Kim | H10K 59/8722 |
| 10,559,505 | B2* | 2/2020 | Yamamoto | B32B 27/20 |
| 2007/0043166 | A1* | 2/2007 | Hoshika | H01L 23/293 524/763 |
| 2010/0006843 | A1* | 1/2010 | Lee | H10K 59/124 528/34 |
| 2010/0019654 | A1* | 1/2010 | Hayashi | H10K 50/8426 313/498 |
| 2012/0133275 | A1* | 5/2012 | Lee | H10K 50/8445 313/506 |
| 2012/0264838 | A1* | 10/2012 | Larson | C09D 7/61 521/154 |
| 2015/0048326 | A1* | 2/2015 | Cho | H10K 59/873 257/40 |
| 2016/0359141 | A1* | 12/2016 | Yoon | H10K 59/873 |
| 2017/0069871 | A1* | 3/2017 | Yim | H10K 50/15 |
| 2017/0131591 | A1* | 5/2017 | Rantala | C09J 7/30 |
| 2017/0244061 | A1* | 8/2017 | Jin | H10K 59/8731 |
| 2019/0189876 | A1* | 6/2019 | Lee | H10H 20/8515 |
| 2019/0237704 | A1* | 8/2019 | Moon | H10K 59/40 |
| 2019/0326550 | A1* | 10/2019 | Kim | H10K 59/8721 |
| 2020/0211938 | A1* | 7/2020 | Park | H01L 23/49827 |
| 2020/0211956 | A1* | 7/2020 | Wu | H01L 24/09 |
| 2020/0312933 | A1* | 10/2020 | Lee | H10K 50/844 |
| 2021/0183762 | A1* | 6/2021 | Kim | H01L 25/105 |
| 2021/0217718 | A1* | 7/2021 | Guevara | B23K 35/0222 |

FOREIGN PATENT DOCUMENTS

| | | |
|---|---|---|
| KR | 10-2019-0027006 | 3/2019 |
| KR | 10-2022-0016345 | 2/2022 |

* cited by examiner

FIG. 1
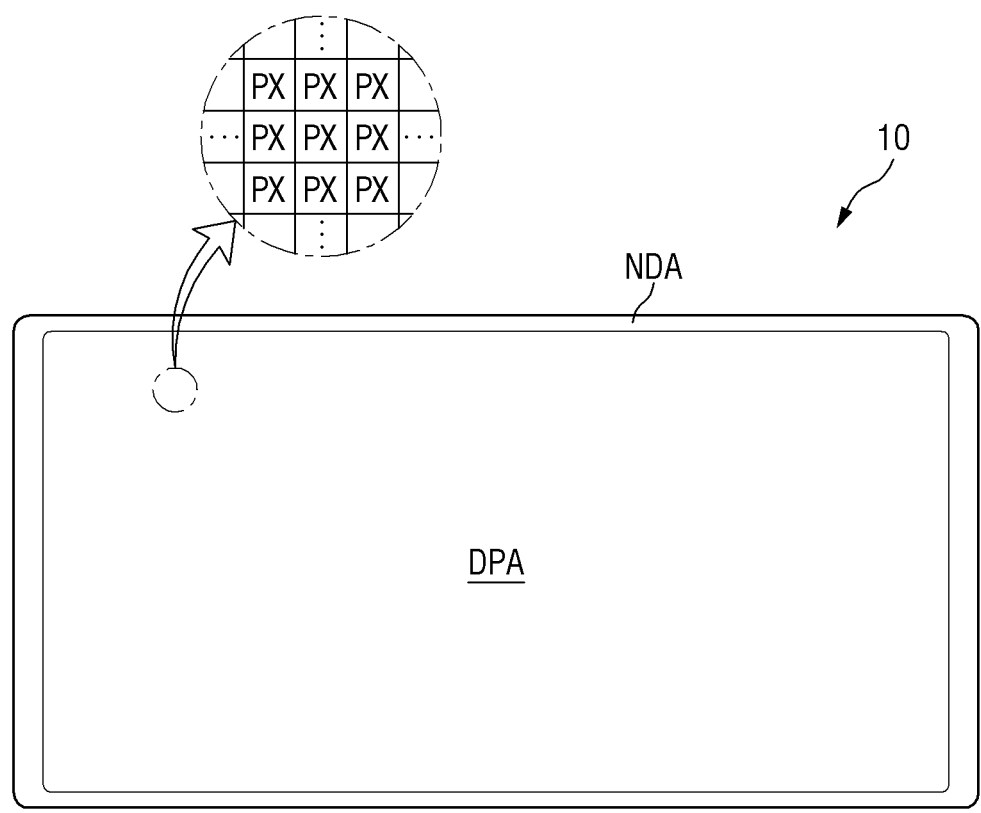
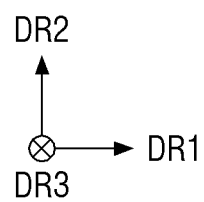

FIG. 2
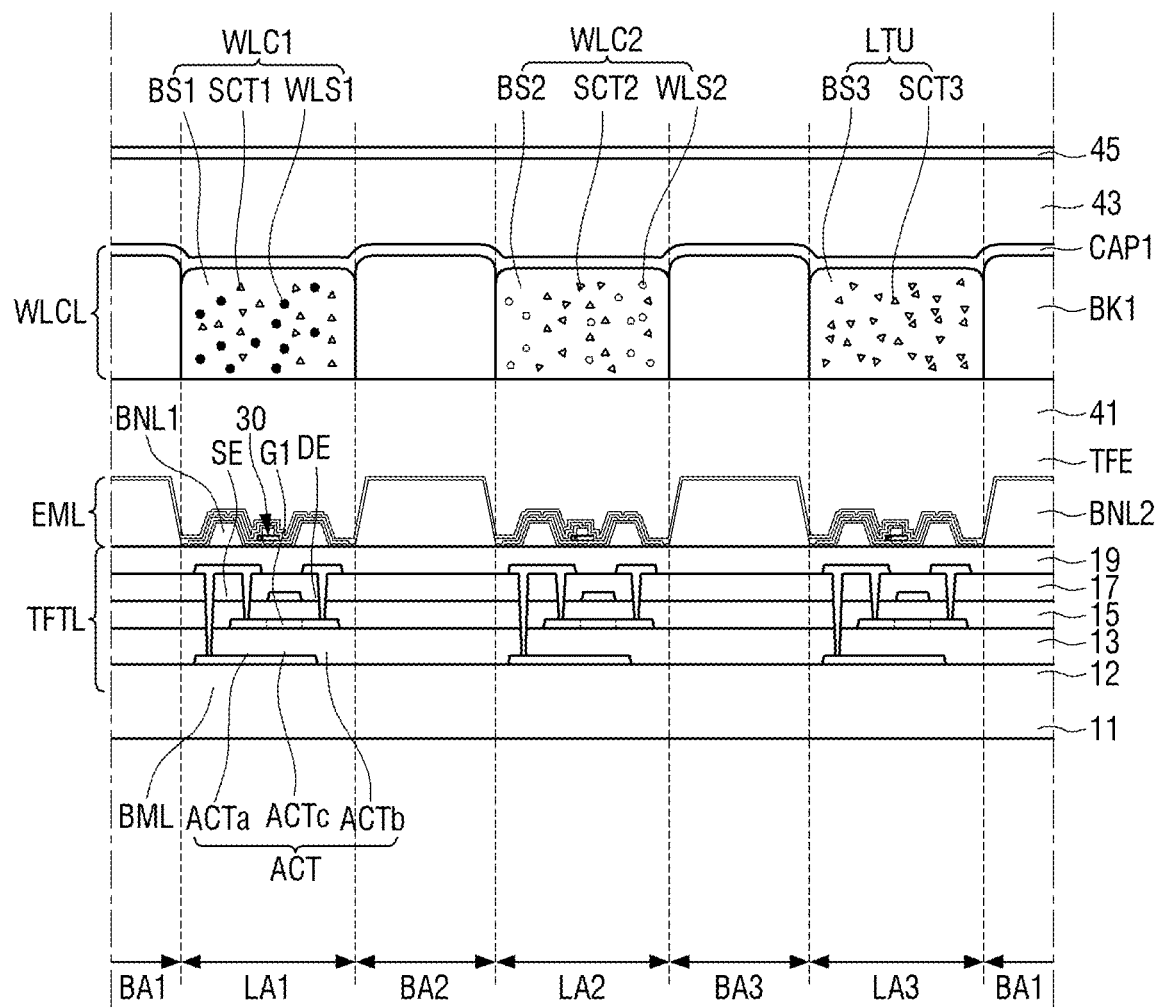
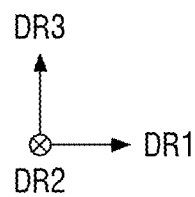

FIG. 12
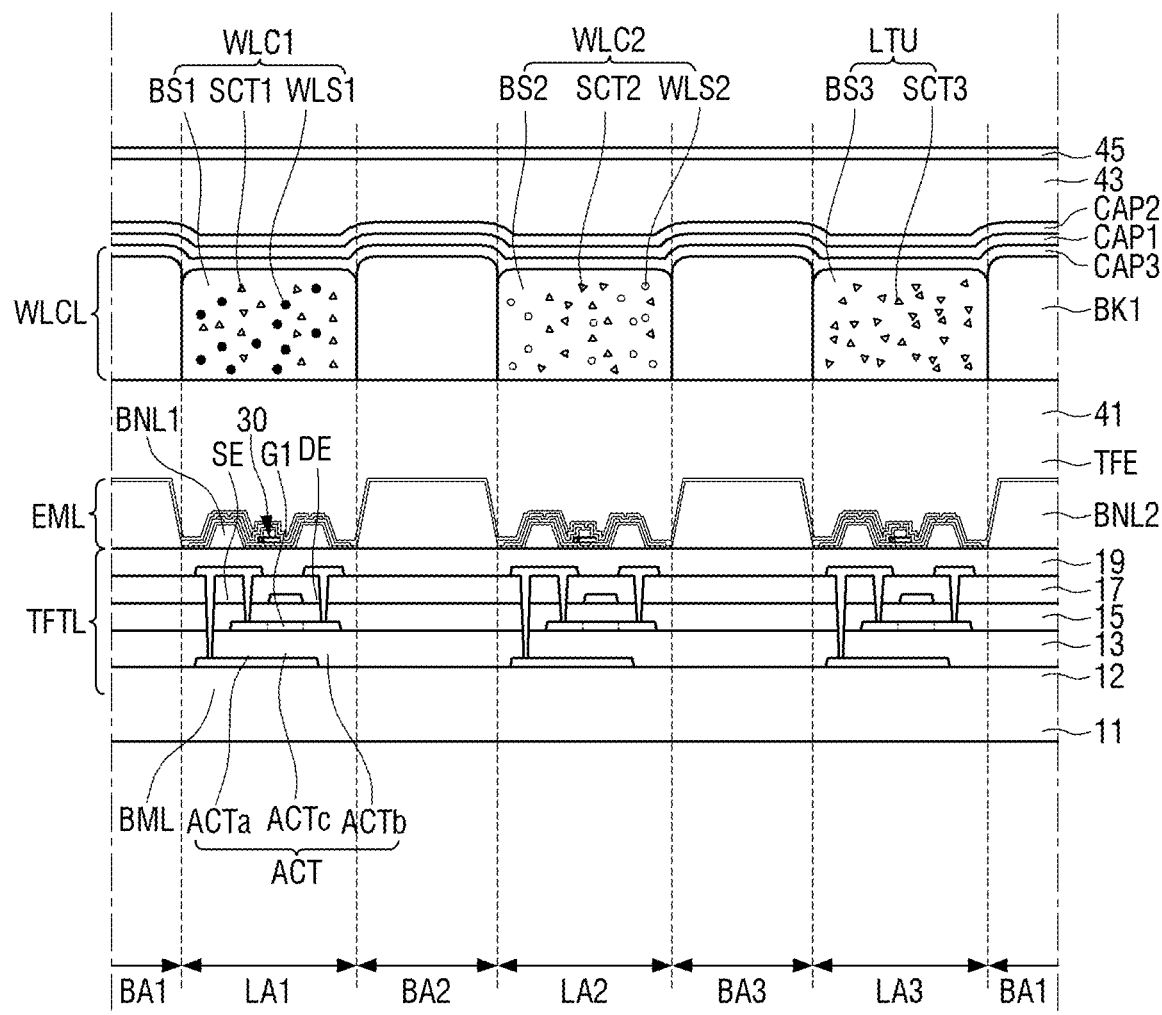
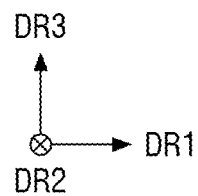

DISPLAY DEVICE INCLUDING A CAPPING LAYER

CROSS-REFERENCE TO RELATED APPLICATION(S)

This application claims priority to and benefits of Korean Patent Application No. 10-2021-0144404 under 35 U.S.C. § 119, filed on Oct. 27, 2021, in the Korean Intellectual Property Office, the entire contents of which are incorporated herein by reference.

BACKGROUND

1. Technical Field

The disclosure relates to a display device.

2. Description of the Related Art

The importance of display devices has increased with the development of multimedia. Accordingly, various types of display devices such as an organic light emitting display (OLED) and a liquid crystal display (LCD) have been used.

The display devices are devices displaying images, and include display panels such as organic light emitting display panels or liquid crystal display panels. Among them, the light emitting display panel may include a light emitting element such as a light emitting diode (LED), and examples of such a light emitting diode include an organic light emitting diode (OLED) that uses an organic material as a light emitting material, an inorganic light emitting diode that uses an inorganic material as a light emitting material, and the like.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device including a capping layer that is capable of being subjected to a low-temperature process and has excellent barrier properties.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may comprise a transistor layer disposed on a substrate, a light emitting element layer disposed on the transistor layer, a wavelength conversion layer disposed on the light emitting element layer, and a first capping layer disposed on the wavelength conversion layer. The first capping layer may include a base and hollow particles mixed in the base. The base may include polysilazane, the polysilazane including siloxane.

In an embodiment, the base may include polysilazane represented by Chemical Formula 1.

[Chemical Formula 1]

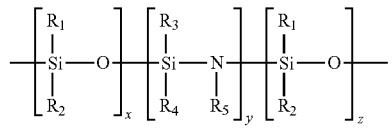

$R_1$ and $R_2$ may be each independently any one selected from H, O, N, alkyl, epoxy, or acrylate. $R_3$ and $R_4$ may be each independently a $C_5$ to $C_{10}$ alkyl chain or an acrylate reactive group. $R_5$ may be any one selected from alkyl, methoxy, and carbon double bond. Integers x, y, and z may each be selected from a range of 1 to 10. The sum of x and z may be less than or equal to y.

In an embodiment, hollow particles may be included in a ratio of about 10% to about 80% with respect to a total volume of the first capping layer.

In an embodiment, a diameter of the hollow particle may be in a range of about 10 nm to about 200 nm.

In an embodiment, hollow particles may be chemically bonded to each other through oxygen atoms.

In an embodiment, a refractive index of the first capping layer may be in a range of about 1.20 to about 1.26.

In an embodiment, a water vapor transmission rate of the first capping layer may be in a range of about 960 mg/m²/day to about 1005 mg/m²/day.

In an embodiment, the wavelength conversion layer may include wavelength conversion parts that convert light emitted from the light emitting element layer. A lower surface of the first capping layer may contact the wavelength conversion parts.

In an embodiment, the display device may further comprise a planarization layer disposed on the first capping layer. An upper surface of the first capping layer may contact the planarization layer.

In an embodiment, the light emitting element layer may include light emitting elements, each of the light emitting elements including semiconductor layers, and connection electrodes electrically contacting ends of the light emitting elements.

In an embodiment, the light emitting element may include a first semiconductor layer including an n-type dopant, a light emitting layer disposed on the first semiconductor layer, and a second semiconductor layer disposed on the light emitting layer and including a p-type dopant.

According to an embodiment of the disclosure, a display device may comprise a light emitting element layer disposed on a substrate, a wavelength conversion layer disposed on the light emitting element layer, and a first capping layer disposed on the wavelength conversion layer. The first capping layer may include polysilazane represented by Chemical Formula 1:

[Chemical Formula 1]

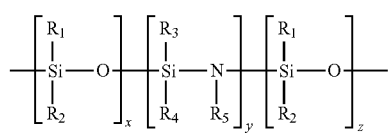

$R_1$ and $R_2$ may be each independently any one selected from H, O, N, alkyl, epoxy, or acrylate. $R_3$ and $R_4$ may be each independently a $C_5$ to $C_{10}$ alkyl chain or an acrylate reactive group. $R_5$ may be any one selected from alkyl, methoxy, or carbon double bond, x, y, and z are each selected from a range of 1 to 10. The sum of x and z may be less than or equal to y.

In an embodiment, the display device may further comprise a second capping layer disposed directly on the first capping layer, the second capping layer including an inorganic material.

In an embodiment, the display device may further comprise a third capping layer disposed between the first capping layer and the wavelength conversion layer, the third capping layer contacting the first capping layer. The third capping layer may include an inorganic material.

In an embodiment, the first capping layer may include a base that includes the polysilazane, and hollow particles mixed in the base.

In an embodiment, the hollow particles may be included in a ratio of about 10% to about 80% with respect to a total volume of the first capping layer.

In an embodiment, a diameter of each of the hollow particle may be in a range of about 10 nm to about 200 nm.

In an embodiment, the hollow particles may be chemically bonded to each other through oxygen atoms.

In an embodiment, a refractive index of the first capping layer may be in a range of about 1.20 to about 1.26.

According to an embodiment of the disclosure, a display device may comprise a substrate, a transistor layer disposed on the substrate, a light emitting element layer disposed on the transistor layer, a wavelength conversion layer disposed on the light emitting element layer, and a first capping layer disposed on the wavelength conversion layer. The first capping layer may include a base and pores in the base. The base includes polysilazane, the polysilazane including siloxane.

With the display device according to embodiments, the first capping layer including polysilazane may act as a barrier having characteristics of an inorganic film. Accordingly, the first capping layer may be cured at a low temperature, and deterioration of wavelength shifters may be prevented. By omitting an additional capping layer, the process may be simplified, and manufacturing costs may be reduced.

According to an embodiment, by forming the first capping layer including polysilazane including siloxane, an organic film quality may be imparted to form a porous film quality as a dense film quality by the hollow particles.

Further, according to an embodiment, the first capping layer includes surface-treated hollow particles, such that an alignment degree of the hollow particles may be improved to increase a film density and facilitate a subsequent process.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which:

FIG. 1 is a schematic plan view of a display device according to an embodiment;

FIG. 2 is a schematic cross-sectional view illustrating one pixel of the display device according to an embodiment;

FIG. 12 is a schematic cross-sectional view illustrating a display device according to an embodiment;

FIG. 14 is a schematic cross-sectional view illustrating a pore of the first capping layer according to an embodiment.

DETAILED DESCRIPTION OF THE EMBODIMENTS

Figure 3:
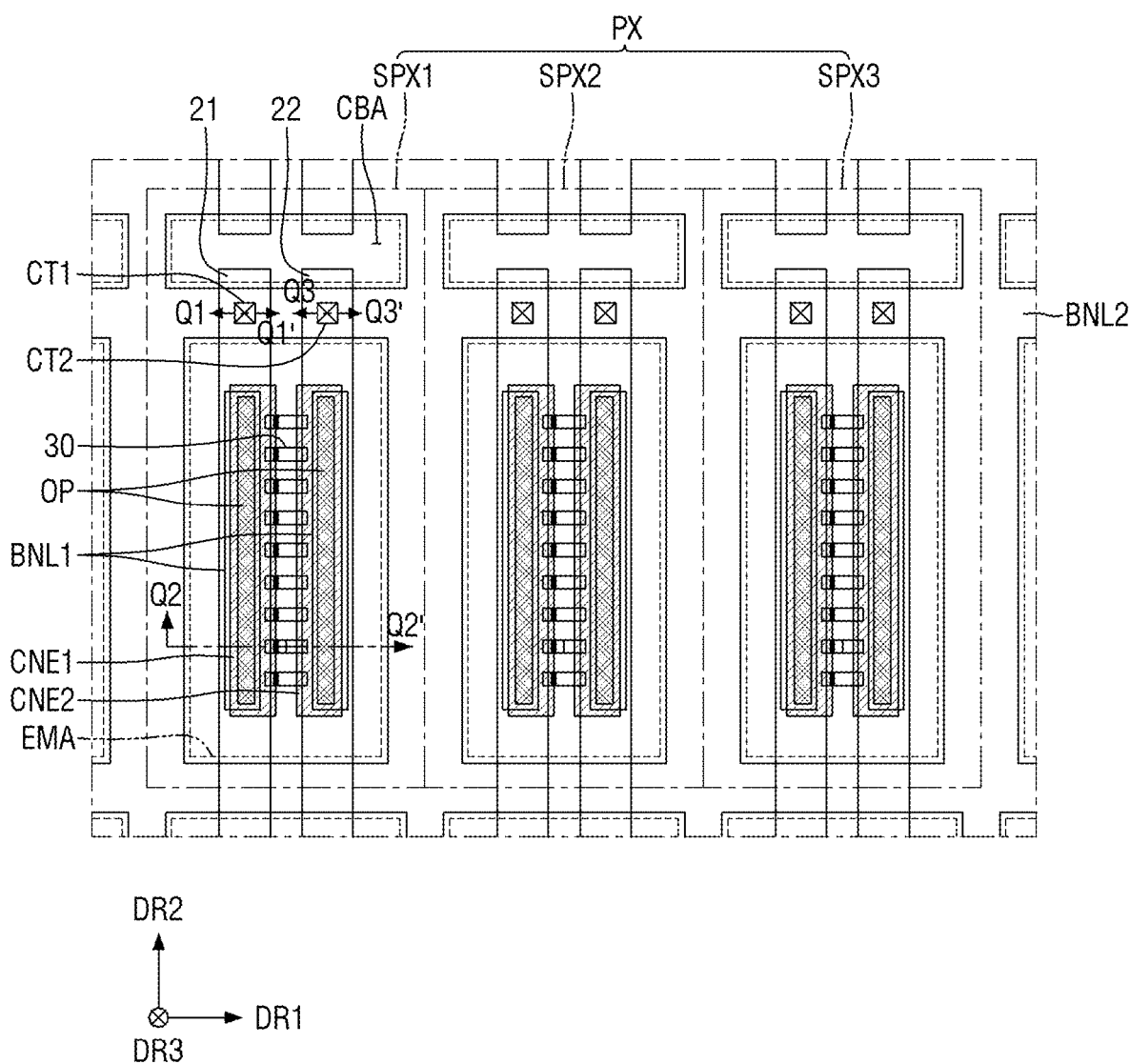
FIG. 3 is a schematic plan view illustrating one pixel of the display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, specific embodiments will be described with reference to the accompanying drawings.

FIG. 1 is a schematic plan view of a display device according to an embodiment.

Referring to FIG. 1, a display device 10 displays a moving image or a still image. The display device 10 may refer to all electronic devices that provide display screens. For example, televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which provide display screens, may be included in the display device 10.

The display device 10 includes a display panel providing a display screen. Examples of the display panel may include an inorganic light emitting diode display panel, an organic light emitting display panel, a quantum dot light emitting display panel, a plasma display panel, a field emission display panel, and the like. Hereinafter, an inorganic light emitting diode display panel is illustrated as an example of the display panel, but the disclosure is not limited thereto, and the disclosure may be applied to other display panels.

A first direction DR1, a second direction DR2, and a third direction DR3 are defined in the drawings of an embodiment for describing the display device 10. The first direction DR1 and the second direction DR2 may be directions perpendicular to each other in one plane. The third direction DR3 may be a direction perpendicular to the plane in which the first direction DR1 and the second direction DR2 are positioned. The third direction DR3 is perpendicular to each of the first direction DR1 and the second direction DR2. In an embodiment for describing the display device 10, the third direction DR3 refers to a thickness direction of the display device 10.

A shape of the display device 10 may be changed. For example, the display device 10 may have a rectangular shape, in a plan view, including long sides in which the first direction DR1 is longer than the second direction DR2. As another example, the display device 10 may have a rectangular shape, in a plan view, including long sides in which the second direction DR2 is longer than the first direction DR1. However, the disclosure is not limited thereto, and the display device 10 may have a shape such as a square shape, a square shape with rounded corners (vertices), other polygonal shapes, or a circular shape. A shape of a display area DPA of the display device 10 may also be similar to an overall shape of the display device 10. The display device 10 and the display area DPA having a rectangular shape in which the first direction DR1 is longer than the second direction DR2 have been illustrated in FIG. 1.

The display device 10 may include the display area DPA and a non-display area NDA. The display area DPA is an area in which a screen may be displayed, and the non-display area NDA is an area in which a screen is not displayed. The display area DPA may also be referred to as an active area, and the non-display area NDA may also be referred to as a non-active area. The display area DPA may occupy substantially the center of the display device 10.

The display area DPA may include pixels PX. pixels PX may be arranged in a matrix direction. A shape of each pixel PX may be a rectangular shape or a square shape in a plan view, but is not limited thereto, and may also be a rhombic shape of which each side is inclined with respect to one direction. The respective pixels PX may be alternately arranged in a stripe pattern or a PENTILE™ pattern. Each of the pixels PX may include one or more light emitting elements emitting light of a specific wavelength band to display a specific color.

The non-display area NDA may be disposed around the display area DPA. The non-display area NDA may entirely or partially surround the display area DPA. The display area DPA may have a rectangular shape, and the non-display areas NDA may be disposed adjacent to four sides of the display area DPA. The non-display area NDA may constitute a bezel of the display device 10. Lines or circuit drivers included in the display device 10 may be disposed or external devices may be mounted, in each of the non-display areas NDA.

FIG. 2 is a schematic cross-sectional view illustrating a pixel of the display device according to an embodiment.

Referring to FIG. 2, the display area DPA (refer to FIG. 1) of the display device 10 may include first to third emission areas LA1, LA2, and LA3. Each of the first to third emission areas LA1, LA2, and LA3 may be an area in which light generated by a light emitting element 30 of the display device 10 is emitted to the outside of the display device 10. The display area of the display device 10 may include first to third light blocking areas BA1, BA2, and BA3 that partition and surround the first to third emission areas LA1, LA2, and LA3.

The display device 10 may include a substrate 11, a buffer layer 12, a transistor layer TFTL, a light emitting element layer EML, a wavelength conversion layer WLCL, and an anti-reflection member 45.

The buffer layer 12 may be disposed on the substrate 11. The buffer layer 12 may be formed as an inorganic film capable of preventing permeation of air or water vapor. For example, the buffer layer 12 may include inorganic films that are alternately stacked.

The transistor layer TFTL may be disposed on the buffer layer 12. The transistor layer TFTL may include a first transistor T1, a first gate insulating layer 13, a first interlayer insulating layer 15, a second interlayer insulating layer 17, and a first planarization layer 19.

The first transistor T1 may be disposed on the buffer layer 12, and may constitute a pixel circuit of each of pixels. For example, the first transistor T1 may be a driving transistor or a switching transistor of the pixel circuit. The first transistor T1 may include an active layer ACT, a gate electrode G1, a source electrode SE, and a drain electrode DE. The active layer ACT may include conductive regions ACTa and ACTb and a channel region ACTc between the conductive regions ACTa and ACTb.

The light emitting element layer EML may be disposed on the transistor layer TFTL. The light emitting element layer EML may include a first pattern BNL1, the light emitting element 30, and a second pattern BNL2. The light emitting element 30 may be disposed on the first transistor T1. The light emitting element 30 may be disposed between a first electrode and a second electrode and may be connected to each of the first connection electrode and the second connection electrode.

A detailed description of the transistor layer TFTL and the light emitting element layer EML described above will be described below with reference to FIGS. 3 to 5.

An encapsulation layer TFE may be disposed on the light emitting element layer EML. The encapsulation layer TFE may cover an upper surface and side surfaces of the light emitting element layer EML. For example, the encapsulation layer TFE may include at least one inorganic film to prevent permeation of oxygen or water vapor. The encapsulation layer TFE may include at least one organic film to protect the light emitting element layer EML from foreign substances such as dust. For example, the encapsulation layer TFE may have a structure in which at least one organic film is stacked between two inorganic films. Each of the inorganic films may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, lithium fluoride, and the like. The organic film may include an acrylic resin, a methacrylic resin, polyisoprene, a vinyl-based resin, an epoxy-based resin, a urethane-based resin, a cellulose-based resin, a perylene-based resin, and the like. However, the structure of the encapsulation layer TFE is not limited to the above-described example, and the stacked structure of the encapsulation layer TFE may be modified.

A second planarization layer 41 may be disposed on the encapsulation layer TFE to planarize an upper portion of the encapsulation layer TFE. The second planarization layer 41 may include an organic material. For example, the second planarization layer 41 may include at least one of an acrylic resin, an epoxy resin, a phenolic resin, a polyamide resin, and a polyimide resin.

The wavelength conversion layer WLCL may be disposed on the second planarization layer 41. The wavelength conversion layer WLCL may include a first light blocking member BK1, a first wavelength conversion part WLC1, a second wavelength conversion part WLC2, a light transmission part LTU, and a first capping layer CAP1.

The first light blocking member BK1 may overlap the first to third light blocking areas BA1, BA2, and BA3 on the second planarization layer 41. The first light blocking member BK1 may overlap the second pattern BNL2 in the thickness direction. The first light blocking member BK1 may block transmission of light. The first light blocking member BK1 may prevent permeation of the light and mixing colors between the first to third emission areas LA1, LA2, and LA3 to improve a color reproduction rate. The first light blocking member BK1 may be disposed in a lattice shape surrounding the first to third emission areas LA1, LA2, and LA3 in a plan view. The first light blocking member BK1 may be disposed so as not to overlap the first to third emission areas LA1, LA2, and LA3.

The first light blocking member BK1 may include an organic light blocking material and a liquid repellent component. The liquid repellent component may be made of a fluorine-containing monomer or a fluorine-containing polymer, and may include a fluorine-containing aliphatic polycarbonate. For example, the first light blocking member BK1 may be made of a black organic material including a liquid repellent component. The first light blocking member BK1 may be formed through coating and exposing processes or the like of an organic light blocking material including a liquid repellent component.

The first light blocking member BK1 includes the liquid repellent component, and may thus separate the first and second wavelength conversion parts WLC1 and WLC2 and the light transmission part LTU into corresponding emission areas LA1 to LA3 For example, when the first and second wavelength conversion parts WLC1 and WLC2 and the light transmission part LTU are formed in an inkjet manner, ink compositions may flow onto an upper surface of the first light blocking member BK1. The first light blocking member BK1 may include the liquid repellent component to guide the ink compositions to flow into each of the emission areas. Accordingly, the first light blocking member BK1 may prevent the ink compositions from being mixed with each other.

The first wavelength conversion part WLC1 may be disposed in the first emission area LA1 on the second planarization layer 41. The first wavelength conversion part WLC1 may be surrounded by the first light blocking member BK1. The first wavelength conversion part WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one of organic materials such as an epoxy-based resin, an acrylic resin, a cardo-based resin, and an imide-based resin.

The first scatterer SCT1 may have a refractive index different from that of the first base resin BS1, and may form an optical interface with the first base resin BS1. For example, the first scatterer SCT1 may include a light scattering material or a light scattering particle scattering at least a portion of transmitted light. For example, the first scatterer SCT1 may include a metal oxide particle such as titanium oxide ($TiO_2$), zirconium oxide ($ZrO_2$), aluminum oxide ($Al_xO_y$), indium oxide ($In_2O_3$), zinc oxide (ZnO), or tin oxide ($SnO_2$) or include an organic particle such as an acrylic resin or a urethane-based resin. The first scatterer SCT1 may scatter light in a random direction regardless of an incident direction of incident light without substantially converting the peak wavelength of the incident light.

The first wavelength shifter WLS1 may convert or shift the peak wavelength of the incident light to a first peak wavelength. For example, the first wavelength shifter WLS1 may convert blue light provided from the light emitting element layer EML into red light having a single peak wavelength in the range of about 610 nm to about 650 nm and emit the red light. The first wavelength shifter WLS1 may be a quantum dot, a quantum rod, or a phosphor. The quantum dot may be a particulate matter emitting a specific color while electrons are transitioning from a conduction band to a valence band.

For example, the quantum dot may be a semiconductor nanocrystal material. The quantum dot may have a specific band gap according to its composition and size to absorb light and then emit light having a unique wavelength.

Examples of semiconductor nanocrystals of the quantum dot may include group IV nanocrystals, group II-VI compound nanocrystals, group III-V compound nanocrystals, group IV-VI compound nanocrystals, or combinations thereof.

For example, the quantum dot may have a core-shell structure including a core including the above-described nanocrystals and a shell surrounding the core. The shell of the quantum dot may serve as a protective layer for maintaining semiconductor characteristics by preventing chemical modification of the core and/or serve as a charging layer for imparting electrophoretic characteristics to the quantum dot. The shell may be a single layer or multiple layers. An interface between the core and the shell may have a concentration gradient in which a concentration of element present in the shell decreases toward the center. The shell of the quantum dot may be made of a metal or non-metal oxide, a semiconductor compound, a combination thereof, or the like.

The light emitted by the first wavelength shifter WLS1 may have a full width of half maximum (FWHM) of an emission wavelength spectrum of about 45 nm or less, about 40 nm or less, or about 30 nm or less, and may further improve color purity and color reproducibility of colors displayed by the display device 10. The light emitted by the first wavelength shifter WLS1 may be emitted toward several directions regardless of the incident direction of the incident light. Accordingly, side visibility of a red color displayed on the first emission area LA1 may be improved.

A portion of the blue light provided from the light emitting element layer EML may be transmitted through the first wavelength conversion part WLC1 without being converted into red light by the first wavelength shifter WLS1. Light incident on a color filter (not shown) without being converted by the first wavelength conversion part WLC1 in the blue light provided from the light emitting element layer EML may be blocked by the color filter (not shown). The red light converted by the first wavelength conversion part WLC1 in the blue light provided from the light emitting element layer EML may be transmitted through the color filter (not shown) and then emitted to the outside. Accordingly, the first emission area LA1 may emit the red light.

The second wavelength conversion part WLC2 may be disposed in the second emission area LA2 on the second planarization layer 41. The second wavelength conversion part WLC2 may be surrounded by the first light blocking member BK1. The second wavelength conversion part WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 and the first base resin BS1 may be made of a same material or may be made of a similar material.

The second scatterer SCT2 may have a refractive index different from that of the second base resin BS2, and may form an optical interface with the second base resin BS2. For example, the second scatterer SCT2 may include a light scattering material or a light scattering particle scattering at least a portion of transmitted light. For example, the second scatterer SCT2 and the first scatterer SCT1 may be made of a same material, or may be made of a similar material. The second scatterer SCT2 may scatter light in a random direction regardless of an incident direction of incident light without substantially converting a peak wavelength of the incident light.

The second wavelength shifter WLS2 may convert or shift the peak wavelength of the incident light to a second peak wavelength different from the first peak wavelength of the first wavelength shifter WLS1. For example, the second wavelength shifter WLS2 may convert blue light provided from the light emitting element layer EML into green light having a single peak wavelength in the range of about 510 nm to about 550 nm and emit the green light. The second wavelength shifter WLS2 may be a quantum dot, a quantum rod, or a phosphor. The second wavelength shifter WLS2 and the first wavelength shifter WLS1 may include a same material or a similar material. The second wavelength shifter WLS2 may be made of the quantum dot, the quantum rod, or the phosphor so that a wavelength conversion range of the second wavelength shifter WLS2 is different from a wavelength conversion range of the first wavelength shifter WLS1.

The light transmission part LTU may be disposed in the third emission area LA3 on the second planarization layer 41. The light transmission part LTU may be surrounded by the first light blocking member BK1. The light transmission part LTU may transmit incident light therethrough while maintaining a peak wavelength of the incident light. The light transmission part LTU may include a third base resin BS3 and third scatterers SCT3.

The third base resin BS3 may include a material having a relatively high light transmittance. The third base resin BS3 may be made of a transparent organic material. For example, the third base resin BS3, the second base resin BS2, or the first base resin BS1 may be made of a same material or may be made of a similar material.

The third scatterer SCT3 may have a refractive index different from that of the third base resin BS3, and may form an optical interface with the third base resin BS3. For example, the third scatterer SCT3 may include a light scattering material or a light scattering particle scattering at least a portion of transmitted light. For example, the third scatterer SCT3, the first scatterer SCT, or the second scatterer SCT2 may be made of a same material or be made of a similar material. The third scatterer SCT3 may scatter light in a random direction regardless of an incident direction of incident light without substantially converting the peak wavelength of the incident light.

Since the wavelength conversion layer WLCL is directly disposed on the second planarization layer 41, the display device 10 may not require a separate substrate for the first and second wavelength conversion parts WLC1 and WLC2 and the light transmission part LTU. Accordingly, the first and second wavelength conversion parts WLC1 and WLC2 and the light transmission part LTU may be easily aligned in the first to third emission areas LA1, LA2, and LA3, respectively, and the thickness of the display device 10 may be reduced.

The first capping layer CAP1 may cover the first and second wavelength conversion parts WLC1 and WLC2, the light transmission part LTU, and the first light blocking member BK1. For example, the first capping layer CAP1 may seal the first and second wavelength conversion parts WLC1 and WLC2 and the light transmission part LTU to prevent damage to or contamination of the first and second wavelength conversion parts WLC1 and WLC2 and the light transmission part LTU. A lower surface of the first capping layer CAP1 may contact the first and second wavelength conversion parts WLC1 and WLC2, the light transmission part LTU, and the first light blocking member BK1. Hereinafter, a detailed description of the first capping layer CAP1 will be described below in detail with reference to FIGS. 6 to 9.

A third planarization layer 43 may be included on the first capping layer CAP1. The third planarization layer 43 may planarize an upper portion of the first capping layer CAP1. The third planarization layer 43 and the second planarization layer 41 may be made of a same material or may be made of a similar material. An upper surface of the first capping layer CAP1 may contact the third planarization layer 43.

The anti-reflection member 45 may be disposed on the third planarization layer 43. The anti-reflection member 45 may absorb light incident from the outside to prevent a display quality from being deteriorated due to reflection of external light. In an embodiment, the anti-reflection member 45 may include a dye capable of absorbing light other than light of first to third colors (e.g., red, green, and blue) to prevent the reflection of the external light.

Hereinafter, the transistor layer TFTL and the light emitting element layer EML will be described in detail through structures of one pixel of the display device 10 according to an embodiment in a plan view and cross-section view.

FIG. 3 is a schematic plan view illustrating a pixel of the display device according to an embodiment.

Referring to FIG. 3, each of pixels PX may include sub-pixels SPXn (here, n is an integer of 1 to 3). For example, a pixel PX may include a first sub-pixel SPX1, a second sub-pixel SPX2, and a third sub-pixel SPX3. The first sub-pixel SPX1, the second sub-pixel SPX2, and the third sub-pixel SPX3 may emit light of a third color. As an example, each of the first sub-pixel SPX1, the second sub-pixel SPX2, and the third sub-pixel SPX3 may emit blue light. However, the disclosure is not limited thereto, the first sub-pixel SPX1 may emit light of a first color, the second sub-pixel SPX2 may emit light of a second color, and the third sub-pixel SPX3 may emit light of a third color. As an example, the first color may be blue, the second color may be green, and the third color may be red. Although the pixel PX in FIG. 3 includes three sub-pixels SPXn (SPX1, SPX2, and SPX3), the disclosure is not limited thereto, and the pixel PX may include a larger number of sub-pixels SPXn.

Each of the sub-pixels SPX1, SPX2, and SPX3 of the display device 10 may include a light emitting part EMA and a non-light emitting part (not illustrated). The light emitting part EMA may be an area in which the light emitting elements 30 are disposed and light of a specific wavelength band is emitted, and the non-light emitting part may be an area in which the light emitting elements 30 are not disposed and the light emitted from the light emitting elements 30 does not arrive, and thus, the light is not emitted. The light emitting part EMA may include an area in which the light emitting elements 30 are disposed, and may include an area in which the light emitted from the light emitting elements 30 is emitted, as an area adjacent to the light emitting elements 30.

The disclosure is not limited thereto, and the light emitting part EMA may also include an area in which the light emitted from the light emitting elements 30 is reflected or refracted by other members and then emitted. Light emitting elements 30 may be disposed in each sub-pixel SPX1, SPX2, and SPX3, and a light emitting part including an area in which light emitting elements 30 are disposed and an area adjacent to light emitting elements 30 may be formed. The light emitting parts EMA may correspond to the above-described emission areas LA1, LA2, and LA3, and the non-light emitting parts may correspond to the above-described light blocking areas BA1, BA2, and BA3.

Each sub-pixel SPX1, SPX2, and SPX3 may include a cut part CBA disposed in the non-light emitting part. The cut part CBA may be disposed on a side of the light emitting part EMA in the second direction DR2. The cut part CBA may be disposed between light emitting parts EMA of sub-pixels SPX1, SPX2, and SPX3 neighboring to each other in the second direction DR2. Light emitting parts EMA and cut parts CBA may be arranged in the display area DPA of the display device 10. For example, light emitting parts EMA and cut parts CBA may be repeatedly arranged in the first direction DR1, respectively, and the light emitting parts EMA and the cut parts CBA may be alternately arranged in the second direction DR2. An interval between the cut parts CBA spaced apart from each other in the first direction DR1 may be smaller than an interval between the light emitting parts EMA spaced apart from each other in the first direction DR1. The second pattern BNL2 may be disposed between the cut parts CBA and the light emitting parts EMA, and the intervals between the cut parts CBA and the light emitting parts EMA may vary depending on a width of the second pattern BNL2. Light is not emitted from the cut parts CBA because the light emitting elements 30 are not disposed in the cut parts CBA, but portions of electrodes 21 and 22 disposed in the respective sub-pixels SPX1, SPX2, and SPX3 may be disposed in the cut parts CBA. The electrodes 21 and 22 disposed for each sub-pixel SPX1, SPX2, and SPX3 may be separated from each other in the cut part CBA.

Figure 4:
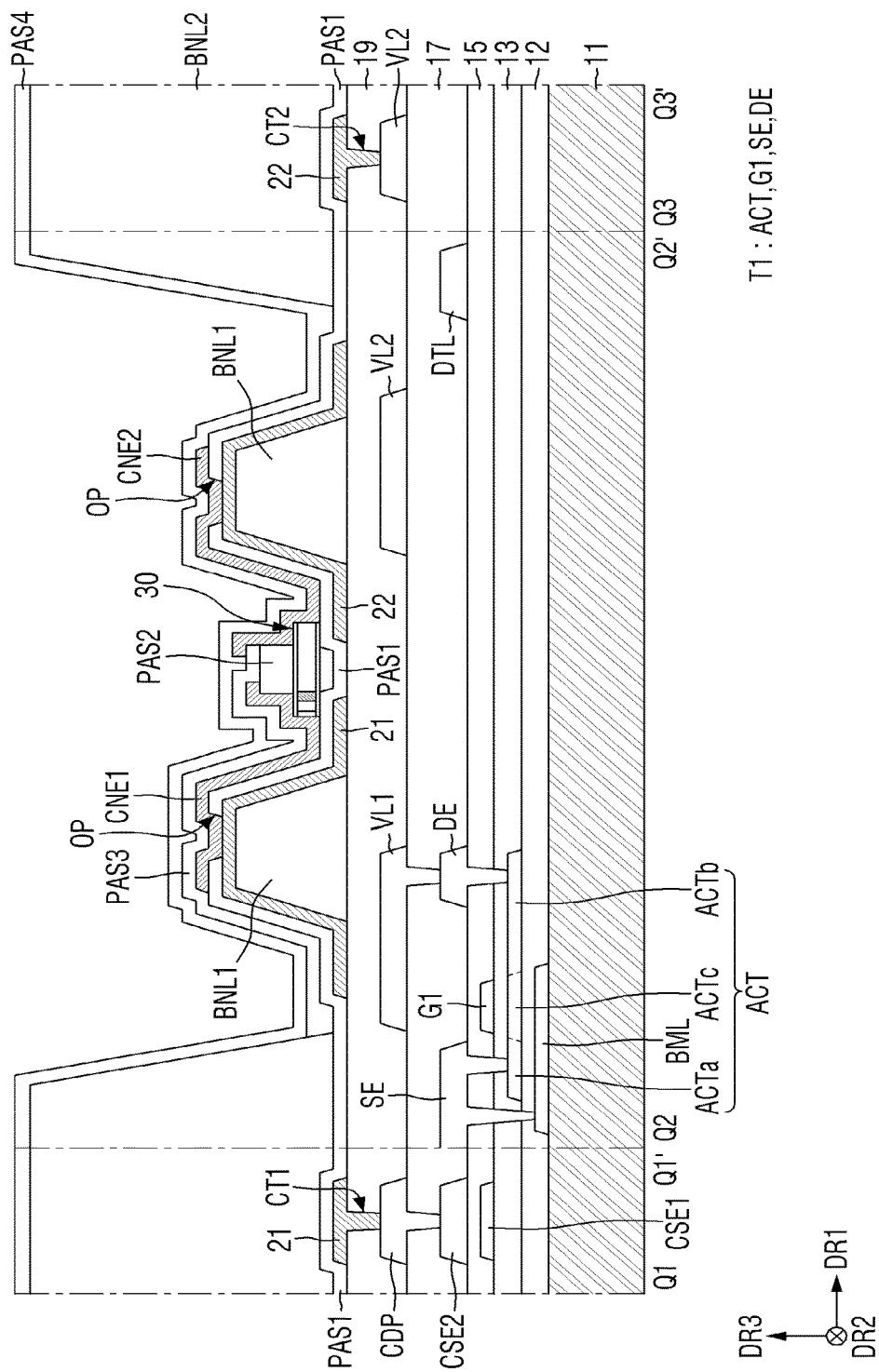
FIG. 4 is a schematic cross-sectional view taken along lines Q1-Q1', Q2-Q2', and Q3-Q3' of FIG. 3.

FIG. 4 is a cross-sectional view taken along lines Q1-Q1', Q2-Q2', and Q3-Q3' of FIG. 3.

Referring to FIG. 4 in conjunction with FIG. 3, the display device 10 may include the substrate 11, and a semiconductor layer, conductive layers, and insulating layers disposed on the substrate 11. The semiconductor layer, the conductive layers, and the insulating layers may constitute a circuit layer and a light emitting element layer of the display device 10, respectively.

A light blocking layer BML may be disposed on the substrate 11. The light blocking layer BML may overlap the active layer ACT of the first transistor T1 of the display device 10. The light blocking layer BML may include a material blocking light to prevent light from being incident on the active layer ACT of the first transistor T1. For example, the light blocking layer BML may be formed of an opaque metal material blocking transmission of the light. However, the disclosure is not limited thereto, and in some cases, the light blocking layer BML may be omitted. The light blocking layer BML may be electrically connected to the source electrode SE to suppress a change in a voltage of the transistor. The light blocking layer BML may be used as a line such as a power line, a data line, or a gate line.

The buffer layer 12 may be disposed on the entire substrate 11 as well as the light blocking layer BML. The buffer layer 12 may be formed on the substrate 11 in order to protect the first transistors T1 of the pixel PX from water vapor permeating through the substrate 11 that may be vulnerable to moisture permeation, and may planarize the surface. The buffer layer 12 may include inorganic layers that are alternately stacked. For example, the buffer layer 12 may be formed as multiple layers in which inorganic layers including at least one of silicon oxide ($SiO_x$), silicon nitride ($SiN_x$), and silicon oxynitride ($SiO_xN_y$) are alternately stacked.

The semiconductor layer may be disposed on the buffer layer 12. The semiconductor layer may include the active layer ACT of the first transistor T1. The active layer ACT may partially overlap, in a plan view, a gate electrode G1 or other components of a first gate conductive layer to be described below.

Only the first transistor T1 of transistors included in the sub-pixel SPX1, SPX2, and SPX3 of the display device 10 has been illustrated in FIG. 4, but the disclosure is not limited thereto. The display device 10 may include a larger number of transistors. For example, the display device 10 may also include two or three transistors by including one or more transistors in addition to the first transistor T1 for each sub-pixel SPX1, SPX2, and SPX3.

The semiconductor layer may include polycrystalline silicon, single crystal silicon, an oxide semiconductor, or the like. When the semiconductor layer includes the oxide semiconductor, each active layer ACT may include conductive regions ACTa and ACTb and a channel region ACTc between the conductive regions ACTa and ACTb. The oxide semiconductor may be an oxide semiconductor containing indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium gallium zinc tin oxide (IGZTO), or the like. In an embodiment, the semiconductor layer may include polycrystalline silicon. The polycrystalline silicon may be formed by crystallizing amorphous silicon. Each of the conductive regions of the active layer ACT may be a doped region doped with impurities.

The first gate insulating layer 13 may be disposed on the semiconductor layer and the buffer layer 12. The first gate insulating layer 13 may be disposed on the buffer layer 12 as well as the semiconductor layer. The first gate insulating layer 13 may function as a gate insulating film of each transistor. The first gate insulating layer 13 may be formed as an inorganic layer including an inorganic material, for example, silicon oxide ($SiO_x$), silicon nitride ($SiN_x$), or silicon oxynitride ($SiO_xN_y$), or may be formed in a structure in which such inorganic layers are stacked.

A first gate conductive layer may be disposed on the first gate insulating layer 13. The first gate conductive layer may include a gate electrode G1 of the first transistor T1 and a first capacitance electrode CSE1 of a storage capacitor. The gate electrode G1 may overlap the channel region ACTc of the active layer ACT in the thickness direction. The first capacitor electrode CSE1 may overlap with a second capacitor electrode CSE2 to be described below in the thickness direction. In an embodiment, the first capacitor electrode CSE1 may be electrically connected to and integrated with the gate electrode G1. The first capacitor electrode CSE1 may overlap the second capacitor electrode CSE2 in the thickness direction, and the storage capacitor may be formed between the first capacitor electrode CSE1 and the second capacitor electrode CSE2.

The first gate conductive layer may be formed as a single layer or multiple layers made of at least one of molybdenum (Mo), aluminum (Al), chromium (Cr), gold (Au), titanium (Ti), nickel (Ni), neodymium (Nd), and copper (Cu), or alloys thereof. However, the disclosure is not limited thereto.

The first interlayer insulating layer 15 may be disposed on the first gate conductive layer. The first interlayer insulating layer 15 may function as an insulating film between the first gate conductive layer and other layers disposed on the first interlayer insulating layer 15. The first interlayer insulating layer 15 may cover the first gate conductive layer, and protect the first gate conductive layer. The first interlayer insulating layer 15 may be formed as an inorganic layer including an inorganic material, for example, silicon oxide ($SiO_x$), silicon nitride ($SiN_x$), or silicon oxynitride ($SiO_xN_y$), or may be formed in a structure in which such inorganic layers are stacked.

A first data conductive layer may be disposed on the first interlayer insulating layer 15. The first data conductive layer may include the source electrode SE and the drain electrode DE of the first transistor T1, a data line DTL, and the second capacitor electrode CSE2.

The source electrode SE and the drain electrode DE of the first transistor T1 may electrically contact the conductive regions ACTa and ACTb of the active layer ACT, respectively, through contact holes penetrating through the first interlayer insulating layer 15 and the first gate insulating layer 13. The source electrode SE of the first transistor T1 may be electrically connected to the light blocking layer BML through another contact hole.

The data line DTL may apply a data signal to another transistor (not illustrated) included in the display device 10. Although not illustrated FIG. 4, the data line DTL may be connected to source/drain electrodes of other transistors to transfer a signal applied from the data line DTL.

The second capacitor electrode CSE2 may overlap the first capacitor electrode CSE1 in the thickness direction. In an embodiment, the second capacitance electrode CSE2 may be integrated with and electrically connected to the source electrode SE.

The first data conductive layer may be formed as a single layer or multiple layers made of at least one of molybdenum (Mo), aluminum (Al), chromium (Cr), gold (Au), titanium (Ti), nickel (Ni), neodymium (Nd), and copper (Cu), or alloys thereof. However, the disclosure is not limited thereto.

The second interlayer insulating layer 17 may be disposed on the first data conductive layer. The second interlayer insulating layer 17 may function as an insulating film between the first data conductive layer and other layers disposed on the second interlayer insulating layer 17. The second interlayer insulating layer 17 may cover the first data conductive layer, and protect the first data conductive layer. The second interlayer insulating layer 17 may be formed as an inorganic layer including an inorganic material, for example, silicon oxide ($SiO_x$), silicon nitride ($SiN_x$), or silicon oxynitride ($SiO_xN_y$), or may be formed in a structure in which such inorganic layers are stacked.

A second data conductive layer may be disposed on the second interlayer insulating layer 17. The second data conductive layer may include a first voltage line VL1, a second voltage line VL2, and a first conductive pattern CDP. A high potential voltage (or a first source voltage) supplied to the first transistor T1 may be applied to the first voltage line VL1, and a low potential voltage (or a second source voltage) supplied to a second electrode 22 may be applied to the second voltage line VL2. An alignment signal necessary for aligning the light emitting elements 30 may be applied to the second voltage line VL2 in the manufacturing process of the display device 10.

The first conductive pattern CDP may be electrically connected to the second capacitor electrode CSE2 through a contact hole formed in the second interlayer insulating layer 17. The second capacitor electrode CSE2 may be integrated with the source electrode SE of the first transistor T1, and the first conductive pattern CDP may be electrically connected to the source electrode SE. The first conductive pattern CDP may also electrically contact a first electrode 21 to be described below, and the first transistor T1 may transfer the first source voltage applied from the first voltage line VL1 to the first electrode 21 through the first conductive pattern CDP. FIG. 4 illustrates the second data conductive layer as including one second voltage line VL2 and one first voltage line VL1, but the disclosure is not limited thereto. The second data conductive layer may include a larger number of first voltage lines VL1 and second voltage lines VL2. However, the disclosure is not limited thereto, and the first data conductive layer may also transfer a signal such as a source voltage. The second data conductive layer may also be omitted.

The second data conductive layer may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, the disclosure is not limited thereto.

The first planarization layer 19 may be disposed on the second data conductive layer. The first planarization layer 19 may include an organic insulating material, for example, an organic material such as polyimide (PI), and may planarize the surface.

First patterns BNL1, electrodes 21 and 22, the light emitting elements 30, connection electrodes CNE1 and CNE2, and a second pattern BNL2 may be disposed on the first planarization layer 19. Insulating layers PAS1, PAS2, PAS3, and PAS4 may be disposed on the first planarization layer 19.

The first patterns BNL1 may be directly disposed on the first planarization layer 19. The first patterns BNL1 may have a shape in which they extend in the second direction DR2 within each sub-pixel SPXn (SPX1, SPX2, or SPX3), but may not extend to the other sub-pixels neighboring in the second direction DR2, and may be disposed within the light emitting part EMA. The first patterns BNL1 may be spaced apart from each other in the first direction DR1, and the light emitting elements 30 may be disposed between the first patterns BNL1. The first patterns BNL1 may be disposed for each sub-pixel SPX1, SPX2, and SPX3 to form a linear pattern in the display area DPA of the display device 10. Two first patterns BNL1 have been illustrated in FIG. 4, but the disclosure is not limited thereto. A larger number of first patterns BNL1 may also be disposed according to the number of electrodes 21 and 22.

At least a portion of the first pattern BNL1 may protrude from the upper surface of the first planarization layer 19. The protruding portion of the first pattern BNL1 may have inclined side surfaces, and the light emitted from the light emitting elements 30 may be reflected from the electrodes 21 and 22 disposed on the first pattern BNL1 and then emitted in an upward direction of the first planarization layer 19. The first pattern BNL1 may function as reflective partition walls reflecting the light emitted from the light emitting elements 30 toward the upward direction while providing an area in which the light emitting elements 30 are disposed. The side surfaces of the first pattern BNL1 may be inclined in a linear shape, but are not limited thereto, and the first pattern BNL1 may have a semi-circular shape or a semi-elliptical shape with a curved outer surface. The first patterns BNL1 may include an organic insulating material such as polyimide (PI), but are not limited thereto.

The electrodes 21 and 22 may be disposed on the first patterns BNL1 and the first planarization layer 19. The electrodes 21 and 22 may include a first electrode 21 and a second electrode 22. The first electrode 21 and the second electrode 22 may extend in the second direction DR2, and may be spaced apart from each other in the first direction DR1.

The first electrode 21 and the second electrode 22 may extend in the second direction DR2 in the sub-pixels SPXn (SPX1, SPX2, or SPX3), but may be separated from the other electrodes 21 and 22 in the cut part CBA. For example, the cut part CBA may be disposed between the light emitting parts EMA of the sub-pixels SPXn neighboring to each other in the second direction DR2, and the first electrode 21 and the second electrode 22 may be separated from the other first and second electrodes 21 and 22 disposed in the sub-pixel SPXn (SPX1, SPX2, or SPX3) neighboring in the second direction DR2 in the cut part CBA. However, the disclosure is not limited thereto, and some electrodes 21 and 22 may not be separated for each sub-pixel SPXn, but may extend beyond the neighboring sub-pixel in the second direction DR2 or only one of the first electrode 21 and the second electrode 22 may be separated.

The first electrode 21 may be electrically connected to the first transistor T1 through a first contact hole CT1, and the second electrode 22 may be electrically connected to the second voltage line VL2 through a second contact hole CT2. For example, the first electrode 21 may electrically contact the first conductive pattern CDP through the first contact hole CT1 penetrating through the first planarization layer 19 at a portion of the second pattern BNL2 extending in the first direction DR1. The second electrode 22 may also electrically contact the second voltage line VL2 through the second contact hole CT2 penetrating through the first planarization layer 19 at a portion of the second pattern BNL2 extending in the first direction DR1. However, the disclosure is not limited thereto. In other examples, the first contact hole CT1 and the second contact hole CT2 may be disposed in the light emitting part EMA surrounded by the second pattern BNL2 and not overlap the second pattern BNL2 in the third direction DR3. In an embodiment, the second electrode 22 may directly contact a first data line layer, such that a voltage may be applied to the second electrode 22.

FIGS. 3 and 4 illustrate that one first electrode 21 and one second electrode 22 are disposed for each sub-pixel SPXn (SPX1, SPX2, or SPX3), but the disclosure is not limited thereto, and the numbers of first electrodes 21 and second electrodes 22 disposed for each sub-pixel SPXn (SPX1, SPX2, or SPX3) may be more than one. The first electrode 21 and the second electrode 22 disposed in each sub-pixel SPXn (SPX1, SPX2, or SPX3) may not necessarily extend in one direction, and the first electrode 21 and the second electrode 22 may be disposed in various structures. For example, the first electrode 21 and the second electrode 22 may have a partially curved or bent shape, and the first electrode 21 or the second electrode 22 may surround the other electrode.

The first electrode 21 and the second electrode 22 may be directly disposed on the first patterns BNL1, respectively. The first electrode 21 and the second electrode 22 may have a width greater than that of the first patterns BNL1, respectively. For example, the first electrode 21 and the second electrode 22 may cover outer surfaces of the first patterns BNL1, respectively. The first electrode 21 and the second electrode 22 may be disposed on the side surfaces of the first patterns BNL1, respectively, and an interval between the first electrode 21 and the second electrode 22 may be smaller than an interval between the first patterns BNL1. At least partial areas of the first electrode 21 and the second electrode 22 may be directly disposed on the first planarization layer 19, such that the first electrode 21 and the second electrode 22 may be disposed on the same plane. However, the disclosure is not limited thereto. In other examples, the width of each of the electrodes 21 and 22 may be smaller than that of the first pattern BNL1. However, each of the electrodes 21 and 22 may cover at least one side surface of the first pattern BNL1 to reflect the light emitted from the light emitting elements 30.

Each of the electrodes 21 and 22 may include a conductive material having high reflectivity. For example, each of the electrodes 21 and 22 may include a metal such as silver (Ag), copper (Cu), or aluminum (Al), or include an alloy including aluminum (Al), nickel (Ni), lanthanum (La), or the like, as the high reflectivity material. Each of the electrodes 21 and 22 may reflect the light emitted from the light emitting elements 30 and traveling toward the side surfaces of the first pattern BNL1 in the upward direction of each sub-pixel SPXn (SPX1, SPX2, or SPX3).

However, the disclosure is not limited thereto, and each of the electrodes 21 and 22 may further include a transparent conductive material. For example, each of the electrodes 21 and 22 may include a material such as indium tin oxide (ITO), indium zinc oxide (IZO), or indium tin zinc oxide (ITZO). In some embodiments, each of the electrodes 21 and 22 may have a structure in which one or more layers made of a transparent conductive material and one or more layers made of a metal having high reflectivity are stacked or may be formed as one layer including the transparent conductive material and the metal having the high reflectivity. For example, each of the electrodes 21 and 22 may have a stacked structure such as ITO/Ag/ITO, ITO/Ag/IZO, or ITO/Ag/ITZO/IZO.

The electrodes 21 and 22 may be electrically connected to the light emitting elements 30, and may receive a selected voltage applied thereto so that the light emitting elements 30 emits light. The electrodes 21 and 22 may be electrically connected to the light emitting elements 30 through the connection electrodes CNE1 and CNE2, and electrical signals applied to the electrodes 21 and 22 may be transferred to the light emitting elements 30 through the connection electrodes CNE1 and CNE2.

One of the first electrode 21 and the second electrode 22 may be electrically connected to an anode electrode of the light emitting element 30, and the other of the first electrode 21 and the second electrode 22 may be electrically connected to a cathode electrode of the light emitting element 30. However, the first electrode 21 and the second electrode 22 are not limited thereto, and vice versa.

Each of the electrodes 21 and 22 may be utilized to form an electric field in the sub-pixel SPX1, SPX2, and SPX3 in order to align the light emitting elements 30 during the manufacturing process. The light emitting elements 30 may be disposed between the first electrode 21 and the second electrode 22 by an electric field formed on the first electrode 21 and the second electrode 22. Ink including the light emitting elements 30 of the display device 10 may be jetted onto the electrodes 21 and 22 through an inkjet printing process. When the ink including the light emitting elements 30 is jetted onto the electrodes 21 and 22, an alignment signal is applied to the electrodes 21 and 22 to generate an electric field. The light emitting elements 30 dispersed in the ink may be aligned on the electrodes 21 and 22 by receiving a dielectrophoretic force by the electric field generated on the electrodes 21 and 22.

A first insulating layer PAS1 may be disposed on the first planarization layer 19. The first insulating layer PAS1 may cover the first patterns BNL1, the first electrode 21, and the second electrode 22. The first insulating layer PAS1 may insulate the first electrode 21 and the second electrode 22 from each other while protecting the first electrode 21 and the second electrode 22. The first insulating layer PAS1 may prevent the light emitting element 30 disposed on the first insulating layer PAS1 from directly contacting and being damaged by other members.

In an embodiment, the first insulating layer PAS1 may include openings OP partially exposing the first electrode 21 and the second electrode 22. The respective openings OP may partially expose portions of the electrodes 21 and 22 disposed on upper surfaces of the first patterns BNL1. Portions of the connection electrodes CNE1 and CNE2 may contact the electrodes 21 and 22 exposed through the openings OP, respectively.

The first insulating layer PAS1 may have a step formed so that a portion of an upper surface thereof is recessed between the first electrode 21 and the second electrode 22. For example, the first insulating layer PAS1 is disposed to cover the first electrode 21 and the second electrode 22, and thus, the upper surface of the first insulating layer PAS1 may be stepped according to shapes of the electrodes 21 and 22 disposed below the first insulating layer PAS1. However, the disclosure is not limited thereto.

The second pattern BNL2 may be disposed on the first insulating layer PAS1. The second pattern BNL2 may be disposed as a lattice-shaped pattern in the entirety of the display area DPA by including portions extending in the first direction DR1 and the second direction DR2 in a plan view. The second pattern BNL2 may be disposed across boundaries between the respective sub-pixels SPXn (SPX1, SPX2, or SPX3) to divide neighboring sub-pixels from each other.

The second pattern BNL2 may surround the light emitting part EMA and the cut part CBA disposed for each sub-pixel SPXn (SPX1, SPX2, or SPX3) to divide the light emitting part EMA and the cut part CBA. The first electrode 21 and the second electrode 22 may extend in the second direction DR2 to cross a portion of the second pattern BNL2 extending in the first direction DR1. A portion disposed between the light emitting parts EMA in a portion of the second pattern BNL2 extending in the second direction DR2 may have a greater width than a portion disposed between the cut parts CBA. Accordingly, an interval between the cut parts CBA may be smaller than an interval between the light emitting parts EMA.

The second pattern BNL2 may have a greater height than the first bank BNL1. The second pattern BNL2 may prevent inks from overflowing into adjacent sub-pixels SPXn (SPX1, SPX2, or SPX3) in an inkjet printing process of the processes of manufacturing the display device 10 to separate inks in which different light emitting elements 30 are dispersed for each of different sub-pixels SPXn (SPX1, SPX2, or SPX3) from each other so that these inks are not mixed with each other. The second pattern BNL2 may include polyimide (PI) like the first pattern BNL1, but is not limited thereto.

The light emitting elements 30 may be disposed on the first insulating layer PAS1. light emitting elements 30 may be spaced apart from each other along the second direction DR2 in which the respective electrodes 21 and 22 extend, and may be aligned to be substantially parallel to each other. The light emitting elements 30 may have a shape in which they extend in one direction, and a direction in which the respective electrodes 21 and 22 extend and a direction in which the light emitting elements 30 extend may be substantially perpendicular to each other. However, the disclosure is not limited thereto, and the light emitting elements 30 are not perpendicular to the direction in which the respective electrodes 21 and 22 extend, and may also be oblique to the direction in which the respective electrodes 21 and 22 extend.

The light emitting elements 30 disposed in each sub-pixel SPXn may include light emitting layers 36 (refer to FIG. 5) including different materials to emit light of different wavelength bands to the outside. Accordingly, light of a first color, light of a second color, and light of a third color may be emitted from the first sub-pixel SPX1, the second sub-pixel SPX2, and the third sub-pixel SPX3, respectively. However, the disclosure is not limited thereto, and the respective sub-pixels SPXn may also include the same type of light emitting element 30 to emit light of substantially the same color.

The light emitting element 30 may have both ends disposed on the electrodes 21 and 22, respectively, between the first patterns BNL1. An extension length of the light emitting element 30 may be greater than the interval between the first electrode 21 and the second electrode 22, and both ends of the light emitting element 30 may be disposed on the first electrode 21 and the second electrode 22, respectively. For example, the light emitting element 30 may be disposed so that one end thereof is put on the first electrode 21 and the other end thereof is put on the second electrode 22.

The light emitting element 30 may include layers disposed in a direction perpendicular to the substrate 11 or the upper surface of the first planarization layer 19. The light emitting element 30 may be disposed so that one direction in which the light emitting element 20 extends is parallel to the upper surface of the first planarization layer 19, and semiconductor layers included in the light emitting element 30 may be sequentially disposed along the direction parallel to the upper surface of the first planarization layer 19. However, the disclosure is not limited thereto, and when the light emitting element 30 has another structure, semiconductor layers may also be disposed in a direction perpendicular to the upper surface of the first planarization layer 19.

Both ends of the light emitting element 30 may contact the connection electrodes CNE1 and CNE2, respectively. For example, an insulating film 38 (refer to FIG. 5) is not formed on an end surface of the light emitting element 30 in one direction in which the light emitting element 30 extends, semiconductor layers 31 and 32 (refer to FIG. 5) or an electrode layer 37 (refer to FIG. 5) may be partially exposed, and the exposed semiconductor layers 31 and 32 (refer to FIG. 5) or electrode layer 37 (refer to FIG. 5) may contact the connection electrodes CNE1 and CNE2. However, the disclosure is not limited thereto, and in the light emitting element 30, at least a partial area of the insulating film 38 is removed, such that both side surfaces of the semiconductor layers 31 and 32 (refer to FIG. 5) may be partially exposed. The exposed side surfaces of the semiconductor layers 31 and 32 (refer to FIG. 5) may also directly contact the connection electrodes CNE1 and CNE2.

A second insulating layer PAS2 may be partially disposed on the light emitting element 30. For example, the second insulating layer PAS2 may have a width smaller than the length of the light emitting element 30 so that both ends of the light emitting element 30 are exposed while surrounding the light emitting element 30, and being disposed on the light emitting element 30. The second insulating layer PAS2 may cover the light emitting element 30, the electrodes 21 and 22, and the first insulating layer PAS1 in the processes of manufacturing the display device 10, and may then be removed to expose the ends of the light emitting element 30. The second insulating layer PAS2 may extend in the second direction DR2 on the first insulating layer PAS1 in a plan view to form a linear or island-shaped pattern in each sub-pixel SPXn (SPX1, SPX2, or SPX3). The second insulating layer PAS2 may protect the light emitting element 30 and fix the light emitting element 30 in the processes of manufacturing the display device 10.

The connection electrodes CNE1 and CNE2 and a third insulating layer PAS3 may be disposed on the second insulating layer PAS2.

The connection electrodes CNE1 and CNE2 may have a shape in which they extend in one direction, and may be disposed on the electrodes 21 and 22, respectively. The connection electrodes CNE1 and CNE2 may include a first connection electrode CNE1 that is disposed on the first electrode 21 and a second connection electrode CNE2 that is disposed on the second electrode 22. The respective connection electrodes CNE1 and CNE2 may be spaced apart from each other or may face each other. For example, the first connection electrode CNE1 and the second connection electrode CNE2 may be disposed on the first electrode 21 and the second electrode 22, respectively, and may be spaced apart from each other in the first direction DR1. The respective connection electrodes CNE1 and CNE2 may form a stripe-shaped pattern in the light emitting part EMA of each sub-pixel SPX1, SPX2, and SPX3.

Each of the connection electrodes CNE1 and CNE2 may contact the light emitting element 30. The first connection electrode CNE1 may contact one end of the light emitting element 30, and the second connection electrode CNE2 may contact the other end of the light emitting element 30. The semiconductor layers may be exposed on both end surfaces of the light emitting element 30 in the direction in which the light emitting element 30 extends, and each of the connection electrodes CNE1 and CNE2 may contact and be electrically connected to the semiconductor layers of the light emitting element 30. One sides of the connection electrodes CNE1 and CNE2 in contact with both ends of the light emitting element 30 may be disposed on the second insulating layer PAS2. The first connection electrode CNE1 may contact the first electrode 21 through the opening OP exposing a portion of an upper surface of the first electrode 21, and the second connection electrode CNE2 may contact the second electrode 22 through the opening OP exposing a portion of an upper surface of the second electrode 22.

A width of each of the connection electrodes CNE1 and CNE2 measured in one direction may be smaller than a width of each of the electrodes 21 and 22 measured in the one direction. The connection electrodes CNE1 and CNE2 may contact one end and the other end of the light emitting element 30, respectively, and cover portions of the upper surfaces of the first electrode 21 and the second electrode 22, respectively. However, the disclosure is not limited thereto, and the connection electrodes CNE1 and CNE2 may have a greater width than the electrodes 21 and 22 to cover both sides of the electrodes 21 and 22.

The connection electrodes CNE1 and CNE2 may include a transparent conductive material. For example, the connection electrodes CNE1 and CNE2 may include ITO, IZO, ITZO, aluminum (Al), or the like. The light emitted from the light emitting element 30 may be transmitted through the connection electrodes CNE1 and CNE2 and travel toward the electrodes 21 and 22. However, the disclosure is not limited thereto.

It has been illustrated in FIGS. 3 and 4 that two connection electrodes CNE1 and CNE2 are disposed in a sub-pixel SPXn, but the disclosure is not limited thereto. The number of connection electrodes CNE1 and CNE2 may vary depending on the number of electrodes 21 and 22 disposed for each sub-pixel SPX1, SPX2, and SPX3.

The third insulating layer PAS3 may cover the first connection electrode CNE1. The third insulating layer PAS3 may cover one side on which the first connection electrode CNE1 is disposed on the basis of the second insulating layer PAS2, as well as the first connection electrode CNE1. For example, the third insulating layer PAS3 may cover the first connection electrode CNE1 and the first insulating layer PAS1 disposed on the first electrode 21. Such a disposition may be formed by a process of entirely disposing an insulating material layer constituting the third insulating layer PAS3 in the light emitting part EMA and then by removing a portion of the insulating material layer in order to form the second connection electrode CNE2. In the above process, the insulating material layer constituting the third insulating layer PAS3 may be removed together with an insulating material layer constituting the second insulating layer PAS2, and a side of the third insulating layer PAS3 may be aligned with a side of the second insulating layer PAS2. The second connection electrode CNE2 may have a side disposed on the third insulating layer PAS3, and may be insulated from the first connection electrode CNE1 with the third insulating layer PAS3 interposed therebetween.

A fourth insulating layer PAS4 may be entirely disposed on the display area DPA of the substrate 11. The fourth insulating layer PAS4 may protect members disposed on the substrate 11 from an external environment. However, the fourth insulating layer PAS4 may also be omitted.

Each of the first insulating layer PAS1, the second insulating layer PAS2, the third insulating layer PAS3, and the fourth insulating layer PAS4 described above may include an inorganic insulating material or an organic insulating material. For example, the first insulating layer PAS1, the second insulating layer PAS2, the third insulating layer PAS3, and the fourth insulating layer PAS4 may include an inorganic insulating material such as silicon oxide ($SiO_x$), silicon nitride ($SiN_x$), silicon oxynitride ($SiO_xN_y$), aluminum oxide ($Al_xO_y$), or aluminum nitride (AlN). In other examples, the first insulating layer PAS1, the second insulating layer PAS2, the third insulating layer PAS3, and the fourth insulating layer PAS4 may include an organic insulating material such as an acrylic resin, an epoxy resin, a phenolic resin, a polyamide resin, a polyimide resin, an unsaturated polyester resin, a polyphenylene resin, a polyphenylene sulfide resin, a benzocyclobutene, a cardo resin, a siloxane resin, a silsesquioxane resin, polymethyl methacrylate, polycarbonate, polymethyl methacrylate-polycarbonate synthetic resin, or the like. However, the disclosure is not limited thereto.

Figure 5:
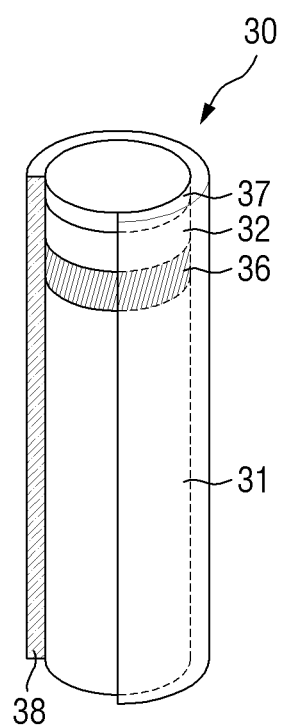
FIG. 5 is a schematic view of a light emitting element according to an embodiment.

FIG. 5 is a schematic view of a light emitting element according to an embodiment.

Referring to FIG. 5, the light emitting element 30 is a particle type element, and may have a rod shape or a cylindrical shape having a selected aspect ratio. The light emitting element 30 may have a size of a nanometer scale (about 1 nm or more and less than about 1 μm) to a micrometer scale (about 1 μm or more and less than about 1 mm). In an embodiment, the light emitting element 30 may have a size of a nanometer scale or have a size of a micrometer scale, in both the length and the diameter. In some other embodiments, the diameter of the light emitting element 30 may have a size of a nanometer scale, while the length of the light emitting element 30 may have a size of a micrometer scale. In some embodiments, some of the light emitting elements 30 have sizes of a nanometer scale in diameter and/or length, while the others of the light emitting elements 30 may have a size of a micrometer scale in diameter and/or length.

In an embodiment, the light emitting element 30 may be an inorganic light emitting diode. The light emitting element 30 may include a semiconductor layer doped with arbitrary conductivity-type (e.g., p-type or n-type) impurities. The semiconductor layer may receive an electrical signal applied from an external power source and emit the electrical signal as light of a specific wavelength band.

The light emitting element 30 according to an embodiment may include a first semiconductor layer 31, a light emitting layer 36, a second semiconductor layer 32, and an electrode layer 37 that are sequentially stacked in a length direction. The light emitting element may further include an insulating film 38 surrounding outer surfaces of the first semiconductor layer 31, the second semiconductor layer 32, and the light emitting layer 36.

The first semiconductor layer 31 may be an n-type semiconductor. When the light emitting element 30 emits light of a blue wavelength band, the first semiconductor layer 31 may include a semiconductor material having a chemical formula of $Al_xGa_yIn_{1-x-y}N$ ($0 \le x \le 1$, $0 \le y \le 1$, and $0 \le x+y \le 1$). For example, the semiconductor material may be one or more of AlGaInN, GaN, AlGaN, InGaN, AlN, and InN doped with an n-type dopant. The first semiconductor layer 31 may be doped with an n-type dopant, which may be Si, Ge, Sn, or the like. For example, the first semiconductor layer 31 may be made of n-GaN doped with n-type Si. A length of the first semiconductor layer 31 may be in the range of about 1.5 μm to about 5 μm, but is not limited thereto.

The second semiconductor layer 32 may be disposed on a light emitting layer 36 to be described below. The second semiconductor layer 32 may be a p-type semiconductor, and when the light emitting element 30 emits light of a blue or green wavelength band, the second semiconductor layer 32 may include a semiconductor material having a chemical formula of $Al_xGa_yIn_{1-x-y}N$ ($0 \le x \le 1$, $0 \le y \le 1$, and $0 \le x+y \le 1$). For example, the semiconductor material may be one or more of AlGaInN, GaN, AlGaN, InGaN, AlN, and InN doped with a p-type dopant. The second semiconductor layer 32 may be doped with a p-type dopant, which may be Mg, Zn, Ca, Se, Ba, or the like. For example, the second semiconductor layer 32 may be made of p-GaN doped with p-type Mg. A length of the second semiconductor layer 32 may be in the range of about 0.05 μm to about 0.10 μm, but is not limited thereto.

FIG. 5 illustrates each of the first semiconductor layer 31 and the second semiconductor layer 32 as being single layers, but the disclosure is not limited thereto. Each of the first semiconductor layer 31 and the second semiconductor layer 32 may further include a larger number of layers, for example, a clad layer or a tensile strain barrier reducing (TSBR) layer, depending on a material of the light emitting layer 36.

The light emitting layer 36 may be disposed between the first semiconductor layer 31 and the second semiconductor layer 32. The light emitting layer 36 may include a material having a single or multiple quantum well structure. When the light emitting layer 36 includes the material having the multiple quantum well structure, the light emitting layer 36 may have a structure in which quantum layers and well layers are alternately stacked. The light emitting layer 36 may emit light by a combination of electron-hole pairs according to electrical signals applied through the first semiconductor layer 31 and the second semiconductor layer 32. When the light emitting layer 36 emits light of a blue wavelength band, the light emitting layer 36 may include a material such as AlGaN or AlGaInN. When the light emitting layer 36 has the multiple quantum well structure, for example, the structure in which the quantum layers and the well layers are alternately stacked, the quantum layers may include a material such as AlGaN or AlGaInN, and the well layers may include a material such as GaN or AlInN. For example, the light emitting layer 36 includes AlGaInN as a material of the quantum layers and AlInN as a material of the well layers, such that the light emitting layer 36 may emit blue light having a central wavelength band in the range of about 450 nm to about 495 nm, as described above.

However, the disclosure is not limited thereto, and the light emitting layer 36 may have a structure in which semiconductor materials having large band gap energy and semiconductor materials having small band gap energy are alternately stacked, and may include other Group III to Group V semiconductor materials according to a wavelength band of emitted light. The light emitted by the light emitting layer 36 is not limited to the light of the blue wavelength band, and in some cases, the light emitting layer 36 may also emit light of red and green wavelength bands. A length of the light emitting layer 36 may be in the range of about 0.05 μm to about 0.10 μm, but is not limited thereto.

The light emitted from the light emitting layer 36 may be emitted not only to an outer surface of the light emitting element 30 in the length direction, but also to both side surfaces of the light emitting element 30. A direction of the light emitted from the light emitting layer 36 is not limited to one direction.

The electrode layer 37 may be an ohmic connection electrode. However, the disclosure is not limited thereto, and the electrode layer 37 may also be a Schottky connection electrode. The light emitting element 30 may include at least one electrode layer 37. FIG. 5 illustrates that the light emitting element 30 includes one electrode layer 37, but the disclosure is not limited thereto. In some cases, the light emitting element 30 may also include a larger number of electrode layers 37 or the electrode layer 37 may also be omitted. The light emitting element 30 will be described below may be similarly applied even though the number of electrode layers 37 is changed or the light emitting element 30 further includes another structure.

The electrode layer 37 may decrease resistance between the light emitting element 30 and the electrode or the connection electrode when the light emitting element 30 is electrically connected to the electrode or the connection electrode in the display device 10 according to an embodiment. The electrode layer 37 may include a conductive metal. The electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 37 may include a semiconductor material doped with an n-type or p-type dopant. The electrode layer 37 may include a single material or include different materials, but is not limited thereto.

The insulating film 38 may surround outer surfaces of semiconductor layers and the electrode layer described above. For example, the insulating film 38 may surround at least an outer surface of the light emitting layer 36, and may extend in the same direction as the light emitting element 30. The insulating film 38 may protect the first semiconductor layer 31, the second semiconductor layer 32, the light emitting layer 36, and the electrode layer 37. The insulating film 38 may surround side surface portions of the first semiconductor layer 31, the second semiconductor layer 32, the light emitting layer 36, and the electrode layer 37, but may expose both ends of the light emitting element 30 in the length direction.

FIG. 5 illustrates that the insulating film 38 may extend in the length direction of the light emitting element 30 to cover side surfaces of the first semiconductor layer 31 to the electrode layer 37, but the disclosure is not limited thereto. The insulating film 38 may cover only outer surfaces of the light emitting layer 36 and some of the semiconductor layers or cover only a portion of an outer surface of the electrode layer 37, such that the outer surface of the electrode layer 37 may be partially exposed. The upper surface of insulating film 38 may be rounded in cross section in a region adjacent to at least one end of the light emitting element 30.

A thickness of the insulating film 38 may be in the range of about 10 nm to about 1.0 μm, but is not limited thereto. The thickness of the insulating film 38 may be about 40 nm.

The insulating film 38 may include insulating materials such as silicon oxide ($SiO_x$), silicon nitride ($SiN_x$), silicon oxynitride ($SiO_xN_y$), aluminum nitride (AlN), and aluminum oxide ($Al_xO_y$). The insulating film 38 may be formed as a single layer or of multiple layers of insulating materials. Accordingly, electrical short circuits that may occur when the light emitting layer 36 is in direct contact with an electrode through which an electrical signal is transferred to the light emitting element 30 may be prevented. The insulating film 38 protects the outer surface of the light emitting element 30 as well as the light emitting layer 36, and may thus prevent a decrease in luminous efficiency.

The outer surface of the insulating film 38 may be surface-treated. The light emitting elements 30 may be ink-jetted onto electrodes while they are dispersed in an ink and may be aligned. In order to keep the light emitting elements 30 dispersed without being agglomerated with other light emitting elements 30 in the ink, a hydrophobic or hydrophilic treatment may be performed on a surface of the insulating film 38. For example, the outer surface of the insulating film 38 may be surface-treated with a material such as stearic acid or 2,3-naphthalene dicarboxylic acid.

The first capping layer CAP1 may be disposed on the wavelength conversion parts WLC1 and WLC2. The first capping layer CAP1 may protect the wavelength conversion parts WLC1 and WLC2 disposed therebelow. In some examples, the first capping layer CAP1 may be made of an organic material or an inorganic material. When the first capping layer CAP1 is made of the organic material, a high temperature of about 400° C. or higher may be required in order to cure the organic material. However, the wavelength shifters included in the wavelength conversion parts WLC1 and WLC2 may deteriorate at high temperatures. The first capping layer CAP1 may be porous, and an additional capping layer may be required on the first capping layer CAP1, and thus, the manufacturing cost and the manufacturing time may increase. The increased manufacturing time may add additional costs.

Hereinafter, in a display device 10 of an embodiment, the first capping layer CAP1 may be cured at a low temperature and a manufacturing cost may be reduced.

Figure 6:
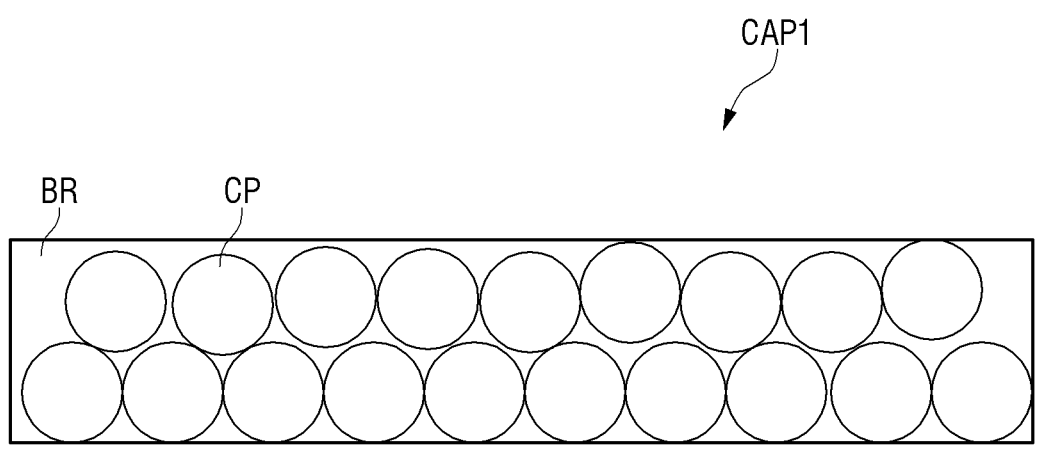
FIG. 6 is a schematic cross-sectional view illustrating a first capping layer according to an embodiment.
Figure 7:
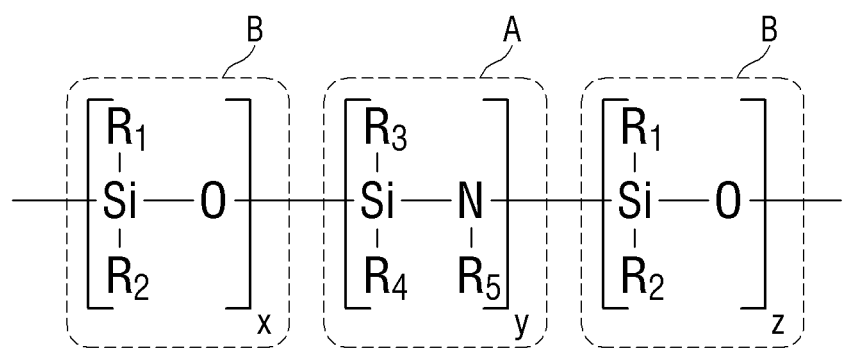
FIG. 7 is a schematic view illustrating a chemical structural formula of polysilazane of the first capping layer according to an embodiment.
Figure 8:
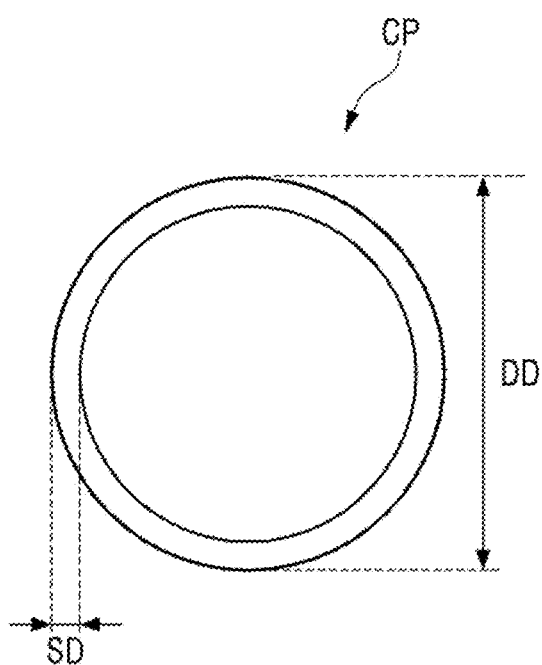
FIG. 8 is a schematic cross-sectional view illustrating a hollow particle according to an embodiment.
Figure 9:
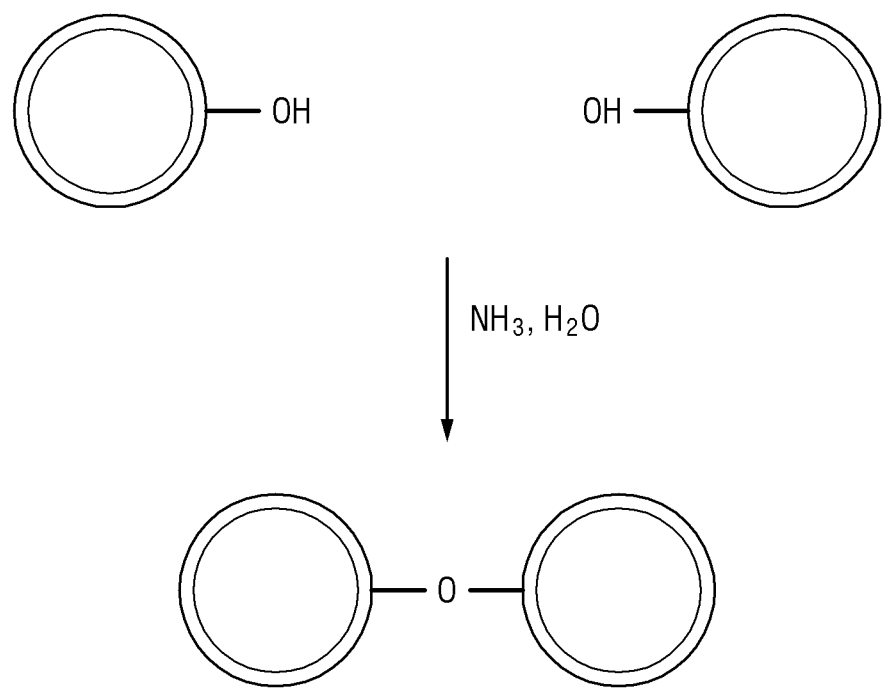
FIG. 9 is a schematic view illustrating a bonding mechanism between hollow particles according to an embodiment.
Figure 10:
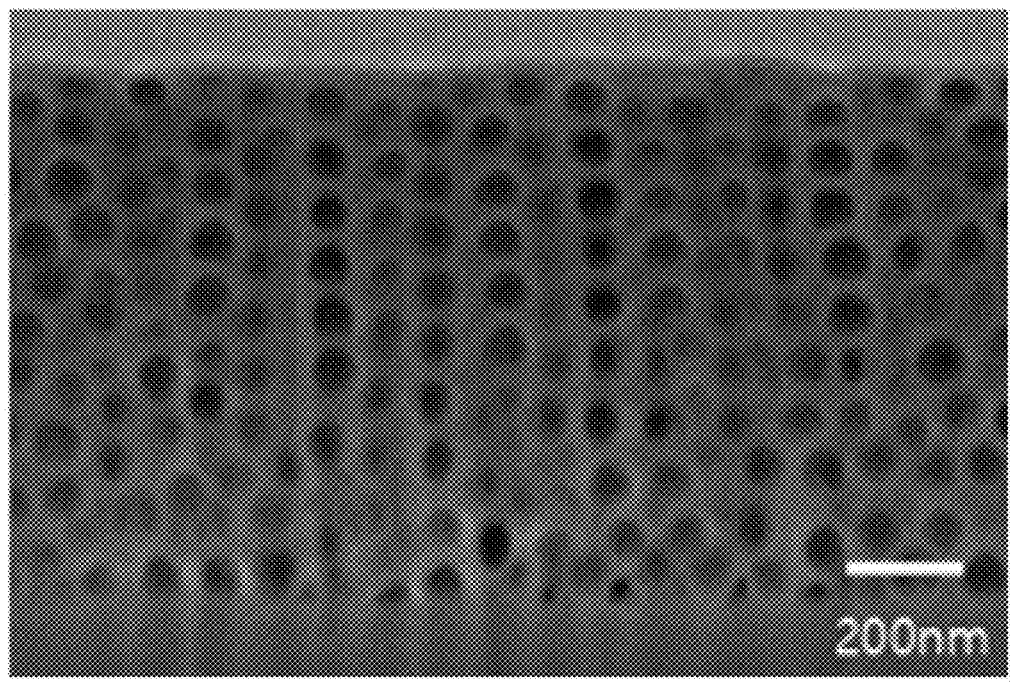
FIG. 10 is an image illustrating the first capping layer according to an embodiment.

FIG. 6 is a schematic cross-sectional view illustrating a first capping layer according to an embodiment. FIG. 7 illustrates the chemical structural formula of polysilazane of the first capping layer according to an embodiment. FIG. 8 is a schematic cross-sectional view illustrating a hollow particle according to an embodiment. FIG. 9 is a schematic view illustrating a bonding mechanism between hollow particles according to an embodiment. FIG. 10 is an image illustrating the first capping layer according to an embodiment.

Referring to FIGS. 6 to 10, the first capping layer CAP1 according to an embodiment may include a base BR and hollow particles CP mixed in the base BR.

The base BR may constitute a base of the first capping layer CAP1, support the hollow particles CP mixed therein, and may exhibit characteristics of an inorganic film of the first capping layer CAP1.

In an embodiment, the base BR may include polysilazane represented by Chemical Formula 1.

<Chemical Formula 1>

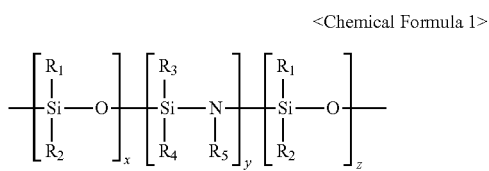

In Chemical Formula 1, $R_1$ and $R_2$ may be independently any one selected from H, O, N, alkyl, epoxy, or acrylate. $R_3$ and $R_4$ may be each independently a $C_5$ to $C_{10}$ alkyl chain or an acrylate reactive group. $R_5$ may be any one selected from alkyl, methoxy, and carbon double bond. The value of x, y, and z may be each an integer value from 1 to 10, and the sum of x and z may be less than or equal to y.

As illustrated in FIG. 7, polysilazane represented by Chemical Formula 1 may include group A and group B. In group A, $R_5$ is an electron donor group, and may be bonded to N. Accordingly, curing reactivity may be increased to enable the first capping layer CAP1 to be cured at a low temperature. $R_3$ and $R_4$ may act as photo-curing sites to improve film density.

Group B is a siloxane, and may impart characteristics of an organic film to the polysilazane. Accordingly, the first capping layer CAP1 may have some characteristics of an organic film, and thus, close adhesion inside the film may be improved.

As described above, since the base BR of the first capping layer CAP1 includes polysilazane, the film density may be improved and thus improve its function as a barrier and enable the first capping layer CAP1 to be cured at a low temperature. For example, the first capping layer CAP1 may be thermally cured at 180° C. or less. Since the base BR includes polysilazane to which siloxane is bonded, the characteristics of an organic film may be imparted, forming a dense porous film of hollow particles CP. Accordingly, the first capping layer CAP1 may act as a barrier of a single film that does not need an additional capping layer. Barrier properties of the first capping layer CAP1 may be increased by decreasing a water vapor transmission rate of the first capping layer CAP1.

The hollow particles CP may be uniformly distributed in the base BR. The hollow particles CP may decrease a refractive index by forming the porous first capping layer CAP1. The hollow particles CP may be made of, for example, hollow silica. In another embodiment, the hollow particles CP may be made of a hollow polymer and that does not have charged particles on its surfaces of the hollow particles CP. The surfaces of the hollow particles CP may be made of acryl, polyimide, urethane, styrene, siloxane, epoxy, or the like through surface treatment.

As illustrated in FIG. 8, the hollow particle CP may have a diameter DD in a range of about 10 to about 200 nm. The diameter DD of the hollow particle CP may not exceed about 200 nm to prevent light from being scattered. A thickness of a shell SD may be in a range about 5 to about 50 nm. However, the disclosure is not limited thereto.

The hollow particles CP may be included in an amount of about 10 to about 50 wt % with respect to the base BR. When a content of the hollow particles CP is about 50 wt % or less with respect to the base BR, deterioration of the barrier properties of the first capping layer CAP1 may be prevented. In other examples, the hollow particles CP may be included in a ratio of about 10% to about 80% with respect to the total volume of the first capping layer CAP1. When a volume ratio of the hollow particles CP is about 10% or more with respect to the total volume of the first capping layer CAP1, a low refractive index may be implemented by decreasing a refractive index of the first capping layer CAP1. Maintaining the volume ratio of the hollow particles CP to about 80% or less with respect to the total volume of the first capping layer CAP1 may avoid hindering the film formability of the first capping layer CAP1.

When a crack occurs in the first capping layer CAP1, the low refractive index film characteristics may deteriorate, and thus, the hollow particles CP need to maintain a selected level or higher degree of alignment. In an embodiment, the hollow particles CP may be surface-treated in order to implement a dense film quality and to improve the alignment degree of the hollow particles CP.

As illustrated in FIG. 9, ammonia ($NH_3$) treatment may be performed on the surfaces of the hollow particles CP to induce a condensation reaction of a surface reactive group. The hollow particles CP may be chemically bonded to each other through oxygen atoms, and improve the alignment degree of the hollow particles CP. When the alignment degree of the hollow particles CP is improved, the film density may be increased and close adhesion of the first capping layer CAP1 to a layer formed in a subsequent process may be increased. This may make the manufacturing process easier.

FIG. 10 is a scanning electron microscope (SEM) image of the first capping layer CAP1. As illustrated in FIG. 10, the alignment degree of the hollow particles CP is improved, such that the hollow particles CP are uniformly arranged.

The first capping layer CAP1 including the base BR and hollow particles CP described above may have a low refractive index. For example, the refractive index of the first capping layer CAP1 may be about 1.3 or less, for example, in a range of about 1.2 to about 1.26. Accordingly, by forming a first capping layer CAP1 that has a lower refractive index than the wavelength shifters included in the wavelength conversion parts, the light emitted from the light emitting element layer EML (refer to FIG. 2) is totally reflected by the first capping layer CAP1, and is reflected again from a lower side and then emitted. Thus, the light efficiency may be increased.

In an embodiment, the first capping layer CAP1 may further include an additive. The additive may include at least one of a thermal curing agent, a UV curing agent, a photoinitiator, and a light absorber to enable the first capping layer CAP1 to be cured. However, the disclosure is not limited thereto.

As described above, the first capping layer CAP1 according to an embodiment may include polysilazane to act as a barrier having the characteristics of an inorganic film. Accordingly, the first capping layer CAP1 may be cured at a low temperature, and may prevent deterioration of the wavelength shifters. By omitting an additional capping layer, the manufacturing process may be simplified, and manufacturing cost may be reduced.

Since the first capping layer CAP1 according to an embodiment includes polysilazane including siloxane, an organic film quality may be imparted to form a porous and dense film by the hollow particles CP.

The first capping layer CAP1 according to an embodiment may include surface-treated hollow particles CP, such that the alignment degree of the hollow particles CP may be improved to increase the film density and facilitate subsequent manufacturing processes.

Figure 11:
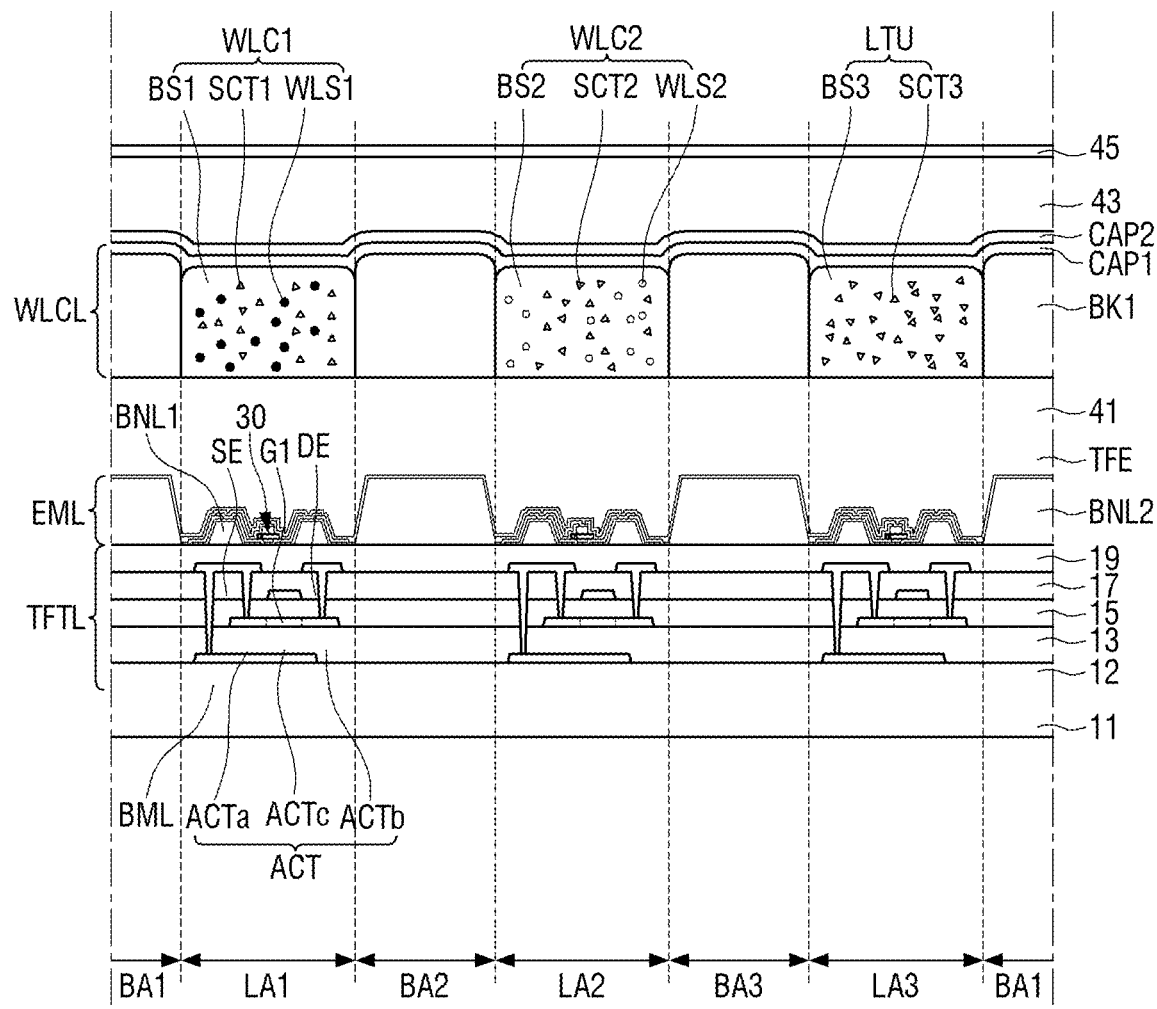
FIG. 11 is a schematic cross-sectional view illustrating a display device according to another embodiment.

FIG. 11 is a schematic cross-sectional view illustrating a display device according to an embodiment. FIG. 12 is a schematic cross-sectional view illustrating a display device according to an embodiment.

Referring to FIGS. 11 and 12, display devices according to the embodiments are different from the display device according to the embodiment described above with reference to FIGS. 2 to 10 in that they further include a second capping layer CAP2 or a third capping layer CAP3 in addition to the first capping layer CAP1. Hereinafter, components that were described above will be omitted, and descriptions of the embodiments will focus on the differences.

As illustrated in FIG. 11, a second capping layer CAP2 may be disposed on the first capping layer CAP1. The second capping layer CAP2 may be disposed between the first capping layer CAP1 and the third planarization layer 43. The second capping layer CAP2 may provide additional protection to layers disposed below the above-described first capping layer CAP1. A lower surface of the second capping layer CAP2 may contact the first capping layer CAP1, and an upper surface of the second capping layer CAP2 may contact the third planarization layer 43.

The second capping layer CAP2 may include an inorganic material. For example, the second capping layer CAP2 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. However, the disclosure is not limited thereto.

As illustrated in FIG. 12, a second capping layer CAP2 may be disposed on the first capping layer CAP1, and a third capping layer CAP3 may be disposed below the first capping layer CAP1. The third capping layer CAP3 may be disposed between the wavelength conversion parts WLC1 and WLC2 and the first capping layer CAP1. A lower surface of the third capping layer CAP3 may contact the wavelength conversion parts WLC1 and WLC2, and an upper surface of the third capping layer CAP3 may contact the first capping layer CAP1. The third capping layer CAP3 and the second capping layer CAP2 may be made of a same material. However, the disclosure is not limited thereto.

Figure 13:
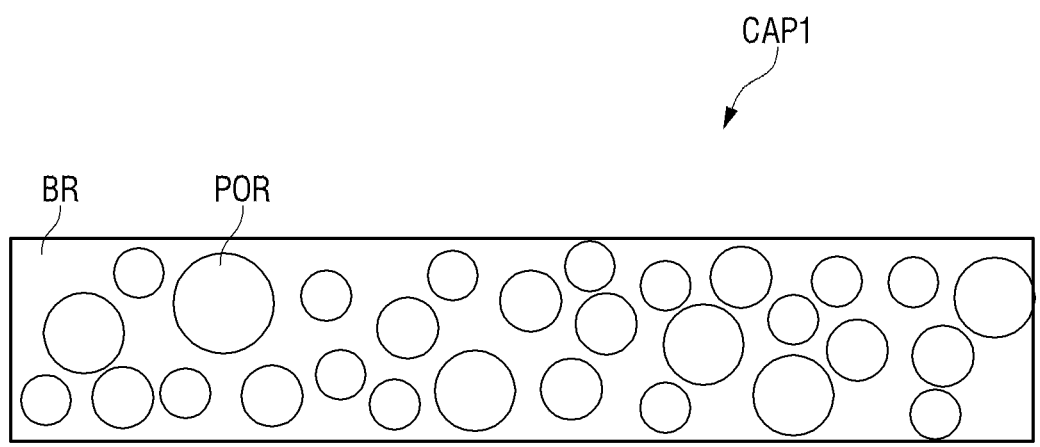
FIG. 13 is a schematic cross-sectional view illustrating a first capping layer according to an embodiment.

FIG. 13 is a schematic cross-sectional view illustrating a first capping layer according to an embodiment. FIG. 14 is a schematic cross-sectional view illustrating a pore of the first capping layer according to an embodiment.

Referring to FIGS. 13 and 14, the embodiment is different from the embodiments described above with reference to FIGS. 6 to 12 in that the first capping layer CAP1 includes pores POR. Hereinafter, descriptions of contents already described in FIGS. 6 to 12 will be omitted and descriptions will focus on the differences from the embodiments described in FIGS. 6 to 12.

The first capping layer CAP1 may include a base BR and pores POR formed in the base BR. The pores POR may be uniformly or randomly distributed in the base BR. The first capping layer CAP1 may include the pores POR to have a porous film quality, and thus, reduce the refractive index of the first capping layer CAP1.

As illustrated in FIG. 14, the pore POR may have a diameter DB of in a range of about 10 nm to about 200 nm. The diameter DB of the pore POR may not exceed about 200 nm to prevent light from being scattered.

In an embodiment, a ratio of the pores POR in the first capping layer CAP1 may be in a range of about 10% to about 80% with respect to the total volume of the first capping layer CAP1. When a volume ratio of the pores POR is about 10% or more with respect to the total volume of the first capping layer CAP1, the refractive index may be reduced, thus implementing a low refractive index layer. Maintaining the volume ratio of the pores POR at about 80% or less with respect to the total volume of the first capping layer CAP1 may avoid hindering the film formability of the first capping layer CAP1.

In the embodiment, by forming the porous first capping layer CAP1 including the pores POR instead of the hollow particles, the refractive index of the first capping layer CAP1 may be reduced, such that the first capping layer CAP1 having a low refractive index may be provided.

Figure 15:
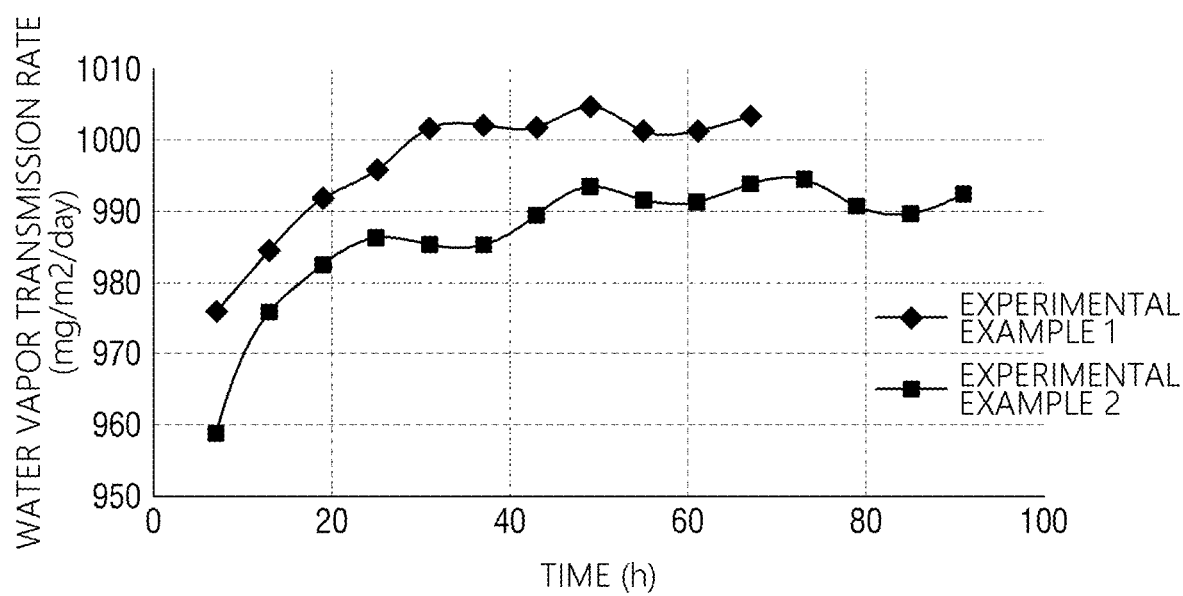
FIG. 15 is a graph illustrating a water vapor transmission rate of the first capping layer according to an embodiment.

FIG. 15 is a graph illustrating a water vapor transmission rate of the first capping layer according to an embodiment. In FIG. 15, a horizontal axis represents a measurement time of a water vapor transmission rate, and a vertical axis represents a water vapor transmission rate.

A first capping layer was formed on a glass substrate and was baked at a temperature of 180° C., and a water vapor transmission rate (WVTR) of the first capping layer was then measured. In Experimental Example 1, the first capping layer was baked for 30 minutes, and in Experimental Example 2, the first capping layer was baked for 60 minutes.

Referring to FIG. 15, both of Experimental Examples 1 and 2 exhibited water vapor transmission rates of about 1005 mg/m$^2$/day or less. Experimental Example 1 exhibited water vapor transmission rates in a range of about 970 mg/m$^2$/day to about 1005 mg/m$^2$/day, and Experimental Example 2 exhibited water vapor transmission rates in a range of about 960 mg/m$^2$/day to about 995 mg/m$^2$/day. Experimental Example 2 in which the first capping layer was baked for 60 minutes exhibited lower water vapor transmission rates than Experimental Example 1.

Through this result, it may be confirmed that the first capping layer according to an embodiment may act as a barrier.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   a transistor layer disposed on a substrate;
   a light emitting element layer disposed on the transistor layer;
   a wavelength conversion layer disposed on the light emitting element layer, the wavelength conversion layer comprises wavelength shifters configured to convert a peak wavelength of incident light to a second wavelength different from the peak wavelength; and a first capping layer disposed on the wavelength conversion layer, wherein the first capping layer includes:
a base; and
hollow particles mixed in the base, and
the base includes polysilazane, the polysilazane including siloxane.

2. The display device of claim 1, wherein
the polysilazane is represented by Chemical Formula 1:
[Chemical Formula 1]

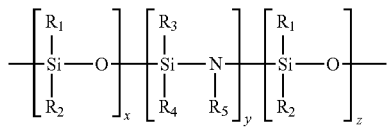

$R_1$ and $R_2$ are each independently any one selected from H, O, N, alkyl, epoxy, and acrylate, $R_3$ and $R_4$ are each independently a $C_5$ to $C_{10}$ alkyl chain or an acrylate reactive group, $R_5$ is any one selected from alkyl, methoxy, and carbon double bond, x, y, and z are each an integer selected from a range of 1 to 10, and a sum of x and z is less than or equal to y.

3. The display device of claim 1, wherein the hollow particles are included in a ratio of about 10% to about 80% with respect to a total volume of the first capping layer.

4. The display device of claim 1, wherein a diameter of a hollow particle among the hollow particles is in a range of about 10 nm to about 200 nm.

5. The display device of claim 1, wherein the hollow particles are chemically bonded to each other through oxygen atoms.

6. The display device of claim 1, wherein a refractive index of the first capping layer is in a range of about 1.20 to about 1.26.

7. The display device of claim 1, wherein a water vapor transmission rate of the first capping layer is in a range of about 960 mg/m$^2$/day to about 1005 mg/m$^2$/day.

8. The display device of claim 1, wherein
the wavelength conversion layer includes wavelength conversion parts that convert light emitted from the light emitting element layer, and
a lower surface of the first capping layer contacts the wavelength conversion parts.

9. The display device of claim 8, further comprising:
a planarization layer disposed on the first capping layer, wherein an upper surface of the first capping layer contacts the planarization layer.

10. The display device of claim 1, wherein the light emitting element layer includes:
light emitting elements, each of the light emitting elements including semiconductor layers; and
connection electrodes contacting ends of the light emitting elements.

11. The display device of claim 10, wherein the light emitting element includes:
a first semiconductor layer including an n-type dopant;
a light emitting layer disposed on the first semiconductor layer; and a second semiconductor layer disposed on the light emitting layer and including a p-type dopant.

12. A display device comprising:
a light emitting element layer disposed on a substrate;
a wavelength conversion layer disposed on the light emitting element layer, the wavelength conversion layer comprises wavelength shifters configured to convert a peak wavelength of incident light to a second wavelength different from the peak wavelength; and
a first capping layer disposed on the wavelength conversion layer, wherein
the first capping layer includes polysilazane represented by Chemical Formula 1:

[Chemical Formula 1]

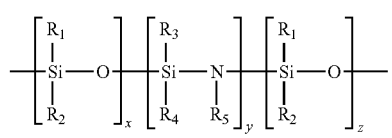

$R_1$ and $R_2$ are each independently any one selected from H, O, N, alkyl, epoxy, and acrylate, $R_3$ and $R_4$ are each independently a $C_5$ to $C_{10}$ alkyl chain or an acrylate reactive group, $R_5$ is any one selected from alkyl, methoxy, and carbon double bond, x, y, and z are each an integer selected from a range of 1 to 10, and a sum of x and z is less than or equal to y.

13. The display device of claim 12, further comprising:
a second capping layer disposed directly on the first capping layer, the second capping layer including an inorganic material.

14. The display device of claim 13, further comprising:
a third capping layer disposed between the first capping layer and the wavelength conversion layer, the third capping layer contacting the first capping layer,
wherein the third capping layer includes an inorganic material.

15. The display device of claim 12, wherein the first capping layer includes:
a base that includes the polysilazane; and
hollow particles mixed in the base.

16. The display device of claim 15, wherein the hollow particles are included in a ratio of about 10% to about 80% with respect to a total volume of the first capping layer.

17. The display device of claim 16, wherein a diameter of each of the hollow particles is in a range of about 10 nm to about 200 nm.

18. The display device of claim 16, wherein the hollow particles are chemically bonded to each other through oxygen atoms.

19. The display device of claim 12, wherein a refractive index of the first capping layer is in a range of about 1.20 to about 1.26.

20. An electronic device comprising:
a transistor layer disposed on a substrate;
a light emitting element layer disposed on the transistor layer;
a wavelength conversion layer disposed on the light emitting element layer, the wavelength conversion layer comprises wavelength shifters configured to convert a peak wavelength of incident light to a second wavelength different from the peak wavelength; and a first capping layer disposed on the wavelength conversion layer, wherein the first capping layer includes:
- a base; and
- pores in the base, and the base includes polysilazane, the polysilazane including siloxane.

* * * * *